(12) United States Patent
Warren

(10) Patent No.: US 7,702,974 B2
(45) Date of Patent: Apr. 20, 2010

(54) TAP TIME DIVISION MULTIPLEXING WITH SCAN TEST

(75) Inventor: Robert Warren, Bristol (GB)

(73) Assignee: STMicroelectronics Limited, Bristol (GB)

( * ) Notice: Subject to any disclaimer, the term of this patent is extended or adjusted under 35 U.S.C. 154(b) by 59 days.

(21) Appl. No.: 11/015,772

(22) Filed: Dec. 17, 2004

(65) Prior Publication Data

US 2005/0216802 A1 Sep. 29, 2005

(51) Int. Cl.
G01R 31/28 (2006.01)
G11C 29/00 (2006.01)
G01R 31/26 (2006.01)

(52) U.S. Cl. .................. 714/724; 714/726; 714/727; 714/729; 365/201; 324/765

(58) Field of Classification Search .................. None
See application file for complete search history.

(56) References Cited

U.S. PATENT DOCUMENTS

| 5,130,988 A * | 7/1992 | Wilcox et al. ............... 714/727 |
| 5,627,842 A | 5/1997 | Brown et al. |
| 5,640,521 A | 6/1997 | Whetsel |
| 5,646,567 A | 7/1997 | Felix |
| 5,828,825 A * | 10/1998 | Eskandari et al. ............. 714/27 |
| 6,085,275 A * | 7/2000 | Gallup et al. ............... 710/316 |
| 6,324,614 B1 * | 11/2001 | Whetsel ...................... 714/726 |
| 6,408,413 B1 * | 6/2002 | Whetsel ...................... 714/727 |
| 6,425,100 B1 * | 7/2002 | Bhattacharya ............... 714/724 |
| 6,691,270 B2 * | 2/2004 | Blasco Allue et al. ....... 714/729 |
| 6,715,105 B1 * | 3/2004 | Rearick ....................... 714/30 |
| 6,829,730 B2 * | 12/2004 | Nadeau-Dostie et al. ...... 714/30 |
| 7,036,058 B1 * | 4/2006 | Miyachi et al. .............. 714/724 |
| 2002/0124216 A1 * | 9/2002 | Blasco Allue et al. ....... 714/726 |
| 2003/0009715 A1 | 1/2003 | Ricchetti et al. |
| 2003/0101376 A1 | 5/2003 | Sanghani |
| 2003/0131296 A1 * | 7/2003 | Park et al. .................... 714/727 |
| 2006/0107160 A1 * | 5/2006 | Ricchetti et al. ............. 714/742 |

OTHER PUBLICATIONS

IEEE Std 1149.1-2001 "IEEE Standard Test Acess Pod and Boundary-Scan Architecture."*
IEEE Standard Test Access Port and Boundary-scan Architecture.*

* cited by examiner

*Primary Examiner*—Cynthia Britt
*Assistant Examiner*—Guerrier Merant

(57) ABSTRACT

An integrated circuit comprising (i) a plurality of portions, each portion including test control circuitry; and (ii) at least one test input arranged to receive test signals, the circuit having a test mode in which one or more of the plurality of portions are testable, wherein the circuit has a reset mode which has priority over the test mode.

20 Claims, 19 Drawing Sheets

FIG. 4

| Current Mode | TAP Signal | | | | Next Mode | Significance |
|---|---|---|---|---|---|---|
| | TCK | nTRST | TMS | TDI | | |
| Any | 0 | 0 | 0 | 0 | Bypass | TAPMux™ reset (with TAP reset for all channels) |
| Bypass | X | 0 | X | X | | TAP reset (for selected bypass channel) |
| | rise | 1 | X | X | | Normal TAP operation (for selected bypass channel) |
| | rise | 0 | 1 | 1 | | calibration |
| | rise | 0 | 0 | 1 | Alert | multiplex_alert |
| Alert | rise | 0 | 1 | 0 | Multiplex | multiplex_mode |
| | rise | 1 | 0 | 0 | Bypass | bypass_selector for channel 0 |
| | rise | 1 | 0 | 1 | | bypass_selector for channel 1 |
| | rise | 1 | 1 | 0 | | bypass_selector for channel 2 |
| | rise | 1 | 1 | 1 | | bypass_selector for channel 3 |
| | rise | 1 | X | X | | bypass_selector |
| | rise | 0 | 0 | X | | Undefined |
| Multiplex | fall rise | Any except all zero | | | Multiplex | Multiplex mode signalling |

Table 2.1 TAPMux Mode Transitions

FIG. 11

| Encoded Token Input | | | Decoded Output | | | | |
|---|---|---|---|---|---|---|---|
| Captured on TCK fall Phase 0 | | | Captured on TCK rise Phase 1 | | | Updated for all channels | Significance |
| nTRST | TMS | TDI | nTRST | TMS | TDI | TCK nTRST TMS TDI | |
| x | x | x | 0 | 0 | 0 | 0  0  0  0 | TAPMux™ reset |
| 0 | 0 | 0 | 0 | 0 | 1 | (reserved) | |
| 0 | 0 | 0 | 0 | 1 | 0 | (reserved) | |
| 0 | 0 | 0 | 0 | 1 | 1 | (reserved) | |
| When half-slot NOT allocated | | | | | | | |
| 0 | 0 | 1 | Identical code for either phase | | | | Idle |
| 0 | 1 | 0 | | | | | |
| 0 | 1 | 1 | | | | | |
| 1 | C₁ | C₀ | | | | | Allocate |
| When half-slot allocated to a channel | | | | | | Updated only for channel allocated to that half-slot | |
| 0 | 0 | 1 | Identical code for either phase | | | 0  1  -  - | Idle |
| 0 | 1 | 0 | | | | 0  0  -  - | Reset |
| 0 | 1 | 1 | | | | 0  1  -  - | Deallocate |
| 1 | M | D | | | | 1  1  M  D | Data |

One frame of 8 tokens

FIG. 16

| When tst_scanmode = 1 | | |
|---|---|---|
| Input Connection | Output Connection | |
| 3 TCK | tmx_TCK(0) | ⎫ |
| 4 notTRST | tmx_notTRST(0) | ⎪ |
| 5 TMS | tmx_TMS(0) | ⎬ 250 |
| 6 TDI | tmx_TDI(0) | ⎪ |
| tmx_TDO(0) | TDO    7 | ⎭ |
| 3 TCK | tmx_TCK(1) | ⎫ |
| tst_rst_n    57 | tmx_notTRST(1) | ⎪ |
| see note a | tmx_TMS(1) | ⎬ 251 |
| see note a | tmx_TDI(1) | ⎪ |
| tmx_TDO(1) | see note b | ⎭ |
| 3 TCK | tmx_TCK(2) | ⎫ |
| tst_rst_n | tmx_notTRST(2) | ⎪ |
| see note a | tmx_TMS(2) | ⎬ 252 |
| see note a | tmx_TDI(2) | ⎪ |
| tmx_TDO(2) | see note b | ⎭ |
| 3 TCK | tmx_TCK(3) | ⎫ |
| tst_rst_n | tmx_notTRST(3) | ⎪ |
| see note a | tmx_TMS(3) | ⎬ 253 |
| see note a | tmx_TDI(3) | ⎪ |
| tmx_TDO(3) | see note b | ⎭ | a. The tmx_TMS(n) and tmx_TDI(n), to each of the secondary TAP controllers, remains connected from the internal functional path in the channel mux/demux logic and is also structurally tested.

b. The tmx_TDO(n) return data, from each of the secondary TAP controllers, remains connected to the internal functional path in the channel mux/demux logic and is also structurally tested.

TAP TIME DIVISION MULTIPLEXING WITH SCAN TEST

CROSS-REFERENCE TO RELATED APPLICATIONS

The present invention is related to those disclosed in the following United States Non-Provisional Patent Applications:
1) Ser. No. 11/015,748 filed concurrently herewith, entitled "TAP MULTIPLEXER";
2) Ser. No. 11/015,330 filed concurrently herewith, entitled "TAP TIME DIVISION MULTIPLEXING"; and
3) Ser. No. 11/015,749 filed concurrently herewith, entitled "TAP SAMPLING AT DOUBLE RATE".

The above applications are commonly assigned to the assignee of the present invention. The disclosures of these related patent applications are hereby incorporated by reference for all purposes as if fully set forth herein.

TECHNICAL FIELD OF THE INVENTION

This invention relates to an integrated circuit.

BACKGROUND OF THE INVENTION

Test access port (TAP) controllers are known in the art. TAP controllers are used to effect communication of test data on and off chip via what is known as a JTAG (joint test action group) port. The functions of known TAP controllers are defined by IEEE Standard 1149.1-1990 which is hereby incorporated by reference. That Standard defines test logic which can be included in an integrated circuit to provide standardised approaches to testing the interconnections between integrated circuits, testing the integrated circuit itself, and observing or modifying circuit activities during the integrated circuit's "normal" or "user mode" operation.

According to the IEEE Standard, the TAP controller is capable of implementing a variety of different test modes. In each of these test modes, test data is supplied to the integrated circuit via an input pin of the TAP controller, and resultant data following the test is supplied off-chip via an output pin of the TAP controller.

Test data can also be input and output on multiple pins of the chip, not passing through the TAP controller, according to the test mode selected. The resultant data is dependent on the test data and is compared with expected data to check the validity of the test. The input and output pins are referred to respectively as TDI (test data input) and TDO (test data output). Many existing integrated circuits already incorporate a TAP controller of this type with the input and output pins TDI and TDO.

The IEEE Standard also defines a test clock signal TCK and a test mode select signal TMS that are inputs to the TAP controller. Optionally, for use in resetting the device, a test reset input signal notTRST (denoted as TRST* in some scripts) is also defined.

Our earlier patent application EP-A-0840217, which is hereby incorporated by reference, describes a system which makes use of these pins and the TAP controller to increase the communication facilities of the integrated circuit without multiplexing the pins and thereby violating the standard.

In the past, processors (CPUs) were manufactured so that a single processor is incorporated in an integrated circuit, requiring off-chip access to all their ancillary circuitry, such as memory. As a result, the integrated circuit had a plurality of access pins so that information about the CPU, in particular memory addressing information, was externally available from these access pins.

In addition to memory addressing information, it is useful to be able to obtain status information about the internal state of the processor to ascertain for example such events as interrupts, changes in streams of instructions, setting of flags in various status registers of the CPU, etc.

Nowadays, chips are more complex and contain not only a processor on-chip but also its associated memory and other ancillary circuitry. Often there is more than one processor on a chip and those processors may interact. Thus, it is no longer a simple matter to monitor the operation of the processor because the signals which are normally available off-chip no longer provide a direct indication as to the internal operation of the CPU(s).

With the increasing complexity of software designed to run on integrated circuit CPUs it is increasingly important to adequately test the software. This requires techniques for monitoring the operation of the CPU while it executes the software. It is a particularly onerous requirement that the software be monitored non-intrusively while it is operating in real time. There is a requirement for a system to achieve this when there are a plurality of CPUs on-chip that are required to be tested. Even where it is not practical or not possible to achieve non-intrusive monitoring, there is still a requirement to gain access to the operation of software being executed on a plurality of CPUs on-chip with the minimum of intrusion.

One possible method of testing a plurality of CPUs on-chip would be to have individual TAP controllers for each CPU, and a set of external pins for communications off-chip for each of the TAP controllers. However, this is undesirable due to the increased number of pins required, which may not be practical if the limit of available pins has already been reached.

Our earlier patent application EP0982595, which is hereby incorporated by reference, describes an alternative method of testing multiple CPUs on a chip. One TAP controller on-chip interfaces between the external pins and a data adaptor. The data adaptor controls communications to two CPUs for testing. Whilst this system is useful in testing a number of CPUs independently, this system is not particularly flexible.

The inventor has recognised that one problem with the known proposal for testing an integrated circuit with more than one processor is the requirement for each processor to have an appropriate interface to the data adaptor. Such a solution is not available where the plurality of CPUs on-chip are not from the same family or company. Typically a CPU for embedded applications will include a JTAG interface but will have no provision for an alternate interface.

SUMMARY OF THE INVENTION

According to one aspect of the invention there is provided an integrated circuit comprising: a plurality of portions, each portion including test control circuitry; at least one test input arranged to receive test signals, said circuit having a test mode in which one or more of said plurality of portions are testable, wherein said circuit has a reset mode which has priority over said test mode.

Preferably said reset mode comprises a bypass mode.
Preferably, the reset mode has the highest priority of any modes of said integrated mode.
Preferably, said test mode is a structural test mode.
Preferably, said test mode is a scan test mode.
Preferably, one of said test control circuitry comprises master test circuitry.

Preferably, said master test circuitry is arranged to test at least one other of said portions of circuit.

Preferably, said master test circuitry is arranged to test all of the other portions of said circuit.

Preferably, said master test circuitry comprises a TAP controller.

Preferably, said test circuitry comprises a TAP multiplexer for multiplexing input and/or output test data to/from a plurality of test circuitry.

Preferably, said TAP multiplexer comprises bypass combinatorial logic and sequential logic.

Preferably, said sequential logic is bypassed in said bypass mode.

Preferably, the sequential logic is tested via said master test circuitry.

Preferably, said test mode takes priority over a multiplexer mode.

According to another aspect of the invention there is provided an integrated circuit comprising a plurality of portions, each portion including test control circuitry; at least one test input arranged to receive test signals; and a multiplexer between said at least one test input and said test control circuitry, said multiplexer having a least one control input whereby the multiplexer is controllable to direct test signals to one of said plurality of portions.

Preferably, at least one test output is arranged to output test signals from one of said plurality of portions, and said multiplexer is arranged between said at least one test output and said test control circuitry, whereby the control input is arranged to direct test signals from one of said plurality of portions to said at least test one output.

Preferably, at least one control input is arranged to receive an input from at least one input of said integrated circuit.

Preferably, at least one control input is arranged to receive an input from at least two inputs of the integrated circuit.

Preferably, the integrated circuit further comprises a state machine and the at least one control input being arranged to receive an input from the state machine.

Preferably, the state machine is controlled in dependence on signals received from said at least one test input.

Preferably, the state machine is arranged to detect at least one combination of test signals, said combination not defined in said JTAG standard and on detection of said combination to enter a multiplex control mode.

Preferably, one combination of signals comprises 0 for a test clock signal, 0 for a not test reset signal, 0 for a test mode signal and 0 for a test data input signal.

Preferably, a following combination of signals comprise a rising clock edge for the test clock signal, 0 for the not test reset signal and the test mode signal and 1 for the test data input signal.

Preferably, when said state machine has entered said multiplex control mode, signals which are received provide information as to which of said portions are selected.

Preferably, the integrated circuit further comprises an arbitrator and the at least one control input is arranged to receive an output dependent on an arbitration decision of said arbitrator.

Preferably, said arbitrator is arranged to arbitrate between an output of said state machine and an input from said at least one input.

Preferably, the output of said state machine is given a higher priority than said input from said at least one input.

Preferably, at least one of said at least one portions of said integrated circuit is at least in partial compliance with the JTAG standard.

Preferably, at least one of said portions comprise at least one of a processor, a memory and functional logic.

Preferably, said at least one input and/or said at least one input for the control input of the multiplexer comprise at least one pin.

Preferably, said at least one output comprises at least one pin.

Preferably, at least one test control circuitry comprises a TAP controller.

According to another aspect of the invention, there is provided an integrated circuit comprising: a plurality of portions, each portion including test control circuitry; at least one test output arranged to output test signals from one of said plurality of portions; and a multiplexer between said at least one test output and said test control circuitry, said multiplexer having at least on control input whereby the multiplexer is controllable to direct test signals from one of said plurality of portions to said at least test one output.

Preferably, oversampling means are provided for oversampling test data received via said at least one test output and controlling the clocking in of said received data in dependence on said oversampling.

According to another aspect of the invention, there is provided an integrated circuit comprising: at least one test input for receiving test data; test control circuitry between said at least one test input and circuitry to be tested; wherein said test data is clocked in on a rising clock edge and a falling clock edge.

According to another aspect of the invention there is provided an integrated circuit comprising: at least one test output for outputting test data; test control circuitry between said at least one test output and circuitry to be tested; wherein said test data is clocked out on a rising clock edge and a falling clock edge.

Preferably, a plurality of test control circuitry are provided and a plurality of circuitry to be tested, wherein test data clocked in or out on the rising clock edge is directed to or from respectively a first one of said test control circuitry and test data clocked in or out on the falling clock edge circuitry is directed to or from respectively a second one of said test control circuitry.

Preferably, said integrated circuit comprises circuitry for separating test data clocked in on the rising edge of the clock signal and test data clocked in on the falling edge of said clock signal.

Preferably, said separating circuitry comprises a plurality of flip-flops, one of which is clocked by a clock signal and the other of which is controlled by an inverse of the clock signal.

Preferably, data is captured by oversampling.

According to another aspect of the invention, there is provided an integrated circuit comprising: a plurality of portions, each portion including test control circuitry; at least one test input arranged to receive test data; wherein said test data is clocked in a plurality of time slots, with test data for different ones of said plurality of portions being allocated to different time slots.

Preferably, each time slot corresponds to a clock cycle.

Preferably, each time slot is divided into two half slots.

Preferably, each half slot of a time slot is allocated to a different one of said plurality of portions.

Preferably, frames are provided each contain n time slots.

Preferably, n is 8.

Preferably, the slots in a frame are allocated to predetermined ones of said plurality of portions of circuitry and said allocation is used for a plurality of said frames.

Preferably, the slots are allocated dynamically.

Preferably, one of said portions of circuitry is allocated to one half of the available slots.

Preferably, one of said portions of said circuitry is allocated to a quarter of the available slots.

Preferably, a given time slot is allocated to a given channel until information is received token to allocated the time slot to a different channel.

Preferably, the data amount per channel is equal to at least one slot.

According to another aspect of the invention, there is provided an integrated circuit comprising: a plurality of portions, each portion including test control circuitry; and a plurality of test inputs arranged to receive test data, wherein in one mode of testing, data is transferred using tokens, with each token comprising m bits, m/2 bits being transferred on a rising edge of a clock signal and m/2 bits being transferred on a falling edge of a clock signal so that a token is transferred in a clock cycle.

Preferably, said token input is encoded.

Preferably, the decoding of said input will be dependent on if a slot has been allocated to a channel or not.

Preferably, if the channel is not allocated to a given slot, a predetermined combination of inputs will allocate the given slot to a channel with said token.

Preferably, if the channel is allocated, the token will provide one of the following: data for the allocated channel; deallocate the slot; provide an idle slot; and provide a reset.

Preferably, a reset mode is triggered when a token provides a predetermined input.

Preferably, information provided by said token may be provided by one half of said token.

Preferably, the two halves of the token are the same in at least some modes of operation of the circuit.

Preferably, a reset mode is provided when one half of the token has all low values.

Preferably, the coding used when a slot is deallocated or allocated is the same, but the information provided will be determined by whether the slot is allocated or not.

According to another aspect, there is provided an integrated circuit having a first mode and a second mode of data transfer, wherein in the first mode of data transfer the time taken for a test data input from external test circuitry to be received and corresponding test data to be output to said external test circuitry is less than a clock period of said external test circuitry and in a second mode of data transfer the time taken for a test data input from external test circuitry to be received and corresponding test data to be output to said external test circuitry is greater than a clock period of said external test circuitry, said integrated circuit comprising: decoding means for decoding said test data input; target circuitry for interacting with said decoded test data input; and encoding means for encoding a signal from said target circuitry for said external test circuitry, wherein said circuit is arranged in both said first and second mode of data transfer to have a n cycle operation in which said decoding means decodes said signal, said target circuitry interacts which said signal and said encoding means encodes said signal.

Preferably, n is 3.

According to another aspect of the invention there is provided test circuitry for testing an integrated circuit, said test circuitry being external to said integrated circuit, said integrated circuit having a first mode and a second mode of data transfer, wherein in the first mode of data transfer the time taken for test data input from said external test circuitry to be received and corresponding test data to be output to said external test circuitry is less than a clock period of said external test circuitry and in a second mode of data transfer the time taken for a test data input from external test circuitry to be received and corresponding test data to be output to said external test circuitry is greater than a clock period of said external test circuitry, said test circuitry having a plurality of buffer locations for buffering signals received from and/or sent to said test circuitry, wherein with the first mode of data transfer, the signals received from and/or sent to the test circuitry have a lower delay provided by said buffer locations than with the second mode of data transfer.

Preferably with the first mode of data transfer at least one of said buffer locations are bypassed.

It should be appreciated that any of the aspects can be used in conjunction with any one or more of the other aspects.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, have, have a property of, or the like; the phrase "hardware testing" refers to structural or manufacturing test, that is the process by which correct manufacture of the silicon or hardware is determined; the phrase "software testing" refers to monitoring or debugging, that is the process by which the correctness of the software or the interaction between software and hardware is determined; and the term "testing" can refer to either one or both of these tests.Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a better understanding of the present invention and to show how the same may be carried into effect, reference will now be made to the accompanying drawings, in which like reference numerals represent like parts, in which:

FIG. 4 shows a table with TAP signals and their significances for the states and state transitions shown in FIG. 3;

FIG. 11 shows a table detailing a coding scheme used in embodiments of the present invention;

FIG. 14 shows a timing diagram for the arrangement of FIG. 12a;

FIG. 16 shows a table listing connections during a scan test of the multiplexer block;

DETAILED DESCRIPTION OF THE INVENTION

FIGS. 1 through 17b, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit having at least one test input.

Figure 1:
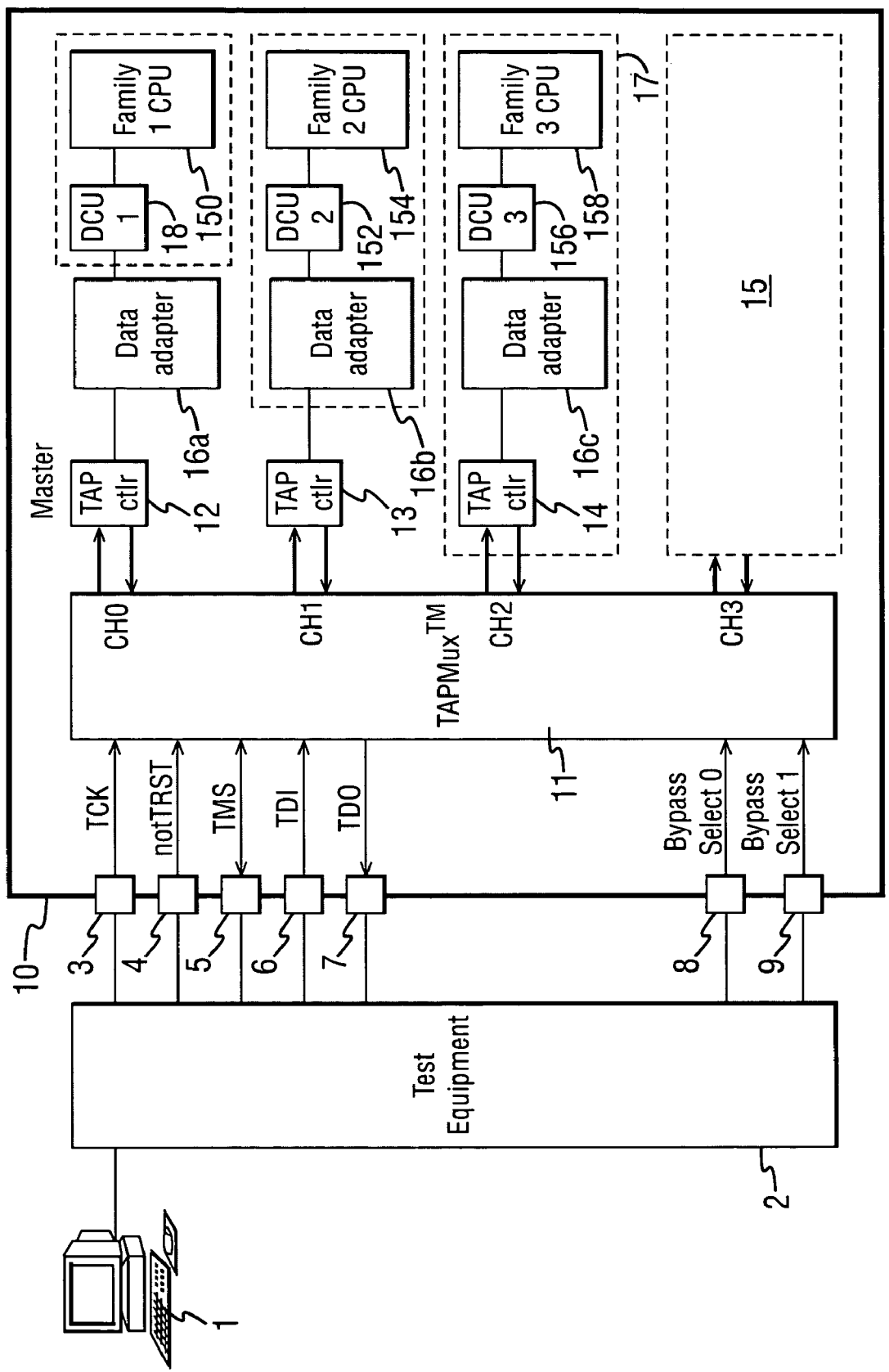
FIG. 1 illustrates schematically a test environment for testing devices on an integrated circuit board according to a first embodiment of the present invention.

FIG. 1 illustrates schematically an embodiment of the present invention. A host computer 1 is connected to test equipment 2 which is in turn connected to external pins 3-9 on an integrated circuit or chip 10. The integrated circuit 10 receives from the test equipment 2 a test clock input TCK on pin 3, a test reset input notTRST on pin 4, a test mode select input TMS on pin 5, a test data input TDI on pin 6, a first channel select input BYPASS_SELECT0 on pin 8 and a second channel select input BYPASS_SELECT1 on pin 9. The bypass select pins may be omitted in some embodiments of the invention. The integrated circuit 10 outputs test data TDO on pin 7 to the test equipment. These inputs and outputs are, except as discussed later, as defined by the JTAG standard.

The test equipment 2 may comprise third party test equipment or debug equipment, or a TAP multiplexer (TAPMux) driver that will be described in more detail later.

On-chip, the external pins 3 to 9 are connected to a multiplexer block 11 (TAPMux) which receives the inputs from the test equipment 2 described above and also outputs the test output to the test equipment. The multiplexer block 11 is connected by four respective input channels and four respective output channels to each of three TAP controllers 12, 13 and 14 and a device 15. Each of the output channels 0-3 from the multiplexer block 11 to the TAP controllers and device comprises the signals: a test clock signal tmx_TCK(n), a test mode select signal tmx_TMS(n), a test data input signal tmx_TDI(n); and a test reset signal tmx_notTRST(n). (n) indicates the channel. Each of the input channels 0-3 to the multiplexer block 11 from the TAP controllers and device 15 comprises a test data output signal tmx_TDO(n).

The first TAP controller 12 communicates via a first interface, that is a first data adapter 16a (one such example of an interface is described in European Patent No 840217 which is hereby incorporated by reference) with a device comprising a first diagnostic control unit DCU1 18 and a first CPU 150. In this exemplary embodiment, the first CPU 150 is of a first type of family of CPUs. The second TAP controller 13 communicates via a second interface 16b or data adapter with a second diagnostic control unit DCU2 152 and a second CPU 154 which belongs to a second type of family of CPUs. The third TAP controller 14 is integrally included in an unit 17 which also includes a third diagnostic control unit DCU3 156 and a third CPU 158. The third data adapter 16c is provided between the TAP controller 14 and the third DCU 156. The third CPU 158 is of a third type or family of CPUs. The final device 15 connected to the multiplexer block 11 comprises logic which may incorporate the functionality of a TAP controller as defined by the IEEE standard or other proprietary logic with a similar interface.

Each of the TAP Controllers, 12, 13, 14, should be regarded as optional.

It should be appreciated that the data adapters 16a-c may be the same or different. Likewise the DCUs 18, 152, 156 may be the same or different.

In some embodiments of the invention, the data adapter and DCU structure may be unknown to the manufacturer of the chip. This may for example occur when third party proprietary circuitry is included on the integrated circuitry.

Different CPU families may be provided by different manufacturers or suppliers, that is third parties.

It should be appreciated that embodiments of the present have been described as having four channels. It should be appreciated that in other embodiments, more or less channels may be provided. In the arrangement shown, each channel is shown as being connected to slightly different elements. In other embodiments of the invention, two or more channels may be connected to the same type of arrangement so there may be fewer than four different types of arrangement. In other embodiments of the invention, the channels may all be connected to the same type of arrangement.

It should be appreciated that the four types of arrangement connected to the four channels are by way of example and any other suitable arrangement may instead be used. The arrangements may include a processor, but in other embodiments of the arrangements may include other entities such as entities for monitoring or accessing an internal bus, arbiter or other algorithmic engines. The different arrangements may provide quite different functions and be made up of different entities.

A TAP controller may be extended by user defined instructions, or otherwise, according to the provisions of the JTAG standard. TAP controller 12 may be one such example. The other TAP controllers 13 and 14 could be the same or different. The device 15 will include a TAP controller function such as provided by the TAP controller 12 but may form an integral part of the arrangement of the device 15.

The operation of the TAP controller in performing tests of an integrated circuit is fully explained in IEEE 1149.1-1990. In summary, finite length scan chains are formed on the integrated circuit such as that formed by a chip boundary scan chain.

The TAP controller is a synchronous finite state machine defined by IEEE Standard 1149.1-1990. IEEE Standard 1149.1-1990 defines test logic which can be included in an integrated circuit to provide standardised approaches to testing the interconnections between integrated circuits, testing the integrated circuit itself, and observing or modifying circuit activity during the integrated circuit's normal operation.

According to the standard, during normal operation of the integrated circuit, the TAP controller is in a reset state, and all its inputs and outputs are inactive. When a test using the test access port according to IEEE Standard 1149.1-1990 is to be performed, the test access port controller operates according to the definitions of that standard. In such a test mode the test access port controller must be able to select at least one test mode of operation. One possible test mode is a scan test mode.

Alternatively or additionally more complex scan operations may be performed, such as scanning in data which is input to functional logic on-chip, functionally clocking the chip for one or more clock cycles, and then scanning out the outputs of the functional logic. Any connection points or circuitry on-chip may be connected for such purposes to form a scan chain. The TAP controller, in addition to being used as a test controller for structural test of on-chip logic via scan chains, may also be used for access to internal state for the purpose of monitoring, control or diagnosis of the functionality or software whilst the chip is being clocked functionally and operating normally. It is assumed that all TAP controllers 12, 13, 14, 15 have additional functionality for diagnostics and that only one TAP controller, 12, is used for structural scan testing of the chip. This may be different in different embodiments of the invention, where more than one TAP controller could be used for structural scan testing of the integrated circuit or a different TAP controller can be used.

A full appreciation of such structural scan testing can be gathered from reference to IEEE Standard 1149.1-1990. For specific examples of how scan testing may be performed, reference should be made to European Patent Application Publication Nos. 0698890, 0702239, 0702240, 0702241, 0702242, 0702243, 0709688 in the name of this applicant which are hereby incorporated by reference.

An important aspect of the embodiment of the present invention is that the multiplexer block 11 in FIG. 1, not only provides the multiplexing function required for the diagnosis of the plurality of CPUs, but also, via connection to the TAP controller 12, allows the sequential logic (multiplexer 41—discussed in relation to FIG. 2) of itself to be structurally scan tested.

A characteristic of known test modes using the test access port of IEEE Standard 1149.1-1990 is that the scan chain is of finite length or closed loop, and that the test data output signal TDO is dependent on the test data input signal TDI, and has a time relationship therewith.

In the described embodiment, the diagnostic (software testing) mode of operation of any one of the TAP controllers 12, 13, 14, 15, is provided for carrying out diagnostic procedures of source/destination logic on-chip, which is compatible with IEEE Standard 1149.1-1990. In one such diagnostic test mode, the test data output signal TDO is not dependent on the test data input signal and does not have a time relationship therewith. The chain between the test data input signal TDI and the test data output signal TDO is considered to be of infinite length, or open loop. In the diagnostic mode the TAP controller, whilst continuing to provide all normal functionality, additionally acts as a transport agent carrying full duplex, flow-controlled, unbounded, serial data, although the TAP controller 12 is unaware that this is the form of the data. Conversely the TAP controller normally handles a single stream of data, without any flow control, passing through a selected scan chain.

An overview of the operation of the TAP controller in a test mode will now be given. In a test mode of operation, the test data input signal TDI and the test mode select signal TMS are supplied to the TAP controller under control of the test clock signal TCK. A state machine within the TAP controller acts upon the value of the test mode select signal TMS on each active edge of the test clock signal TCK to cycle through its states accordingly as defined by IEEE Standard 1149.1-1990. The test reset signal notTRST provides for asynchronous initialisation of the TAP controller when in a low logic state in accordance with IEEE Standard 1149.1-1990.

Instructions are loaded in serial fashion from the test data input signal TDI, clocked by the test clock TCK. In accordance with the instruction stored, one of either the scan test mode SCANMODE signal or the diagnostic mode signal DIAGMODE will be set depending on whether it is a scan test or a diagnostic test which is to be performed.

In another mode of test operation, it may be required that the TAP controller of a particular target device merely connect the test data input signal TDI to the test data output signal TDO.

Figure 2:
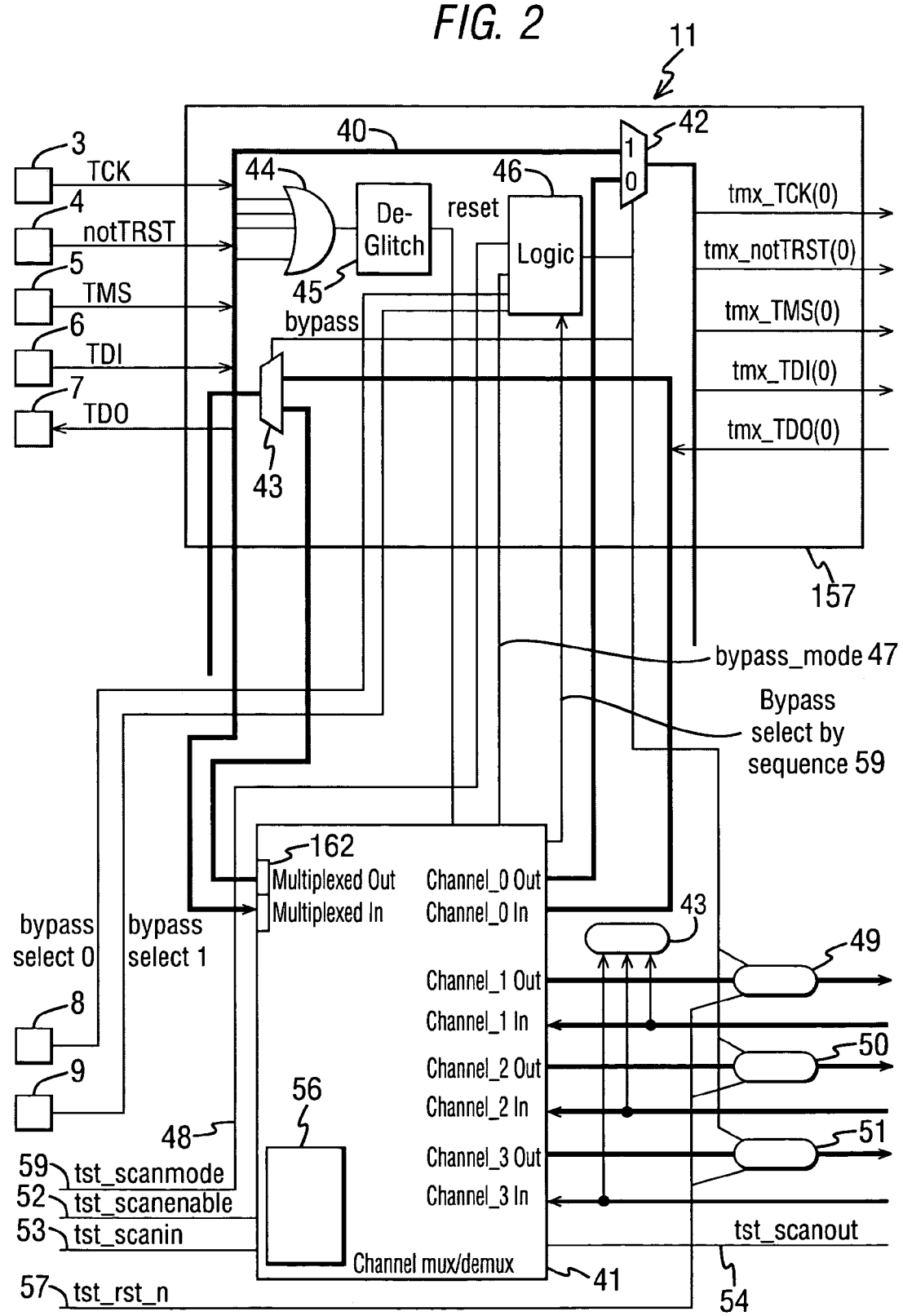
FIG. 2 illustrates schematically the circuitry comprising the multiplexer block of FIG. 1.

If the test mode to be carried out is a scan test mode, then the TAP Controller sets the scan test signal SCANMODE 59 (FIG. 2). In this case, the scan output data SCANOUT is output as the test data output signal TDO. During such a scan mode test data is scanned into the selected scan chain on the scan input signal SCANIN 53 (FIG. 2) which is connected directly to the test data input signal TDI. Scan testing, in particular boundary scan testing, is fully described in IEEE Standard 1149.1-1990. It will be appreciated that additional control signals, in accordance with the test to be performed, need to be supplied to the selected scan chain to achieve the required test operation.

A diagnostic mode may also be entered, in which case the TAP controller sets the diagnostic signal DIAGMODE. Furthermore, the TAP controller will connect the diagnostic or scan mode output signal DIAGSCANOUT to the TDO output, clocked by the negative clock edge of TCK.

In diagnostic mode, the serial data flow between the test data input signal TDI and the test data output signal TDO may be considered to pass through a shift register of infinite length as opposed to the scan test mode, in which mode the serial data flow is through a shift register (shift register chain) of finite length. In the diagnostic mode, a sequence of bit patterns shifted into the test access port as the test data input signal TDI are not reflected in the sequence of bit patterns shifted out of the test access port as the test data output signal. The communication of diagnostic data may include memory access requests from host to target and target to host (reads and writes); status information of CPU registers; data read from host memory or target memory in response to a memory access request; status data for loading into CPU registers; and information about memory addresses being accessed by the target CPU. Thus the diagnostic mode may involve non-intrusive monitoring of data, or intrusive loading of data.

In the diagnostic mode the serial data shifted into the test access port is a uni-directional serial data stream which can be encoded in any desired means, for example, with start and stop bits to delineate data chunks. Likewise, data shifted out via the test access port is a uni-directional serial data stream which can be encoded in any desired means, for example with start and stop bits to delineate data chunks. Normally the data shifted in and the data shifted out will be encoded in the same way. The input and output uni-directional data streams may be used simultaneously to allow full-duplex, bidirectional, serial communications. The sequence of serial data bits could constitute a byte of information.

It should be appreciated that the in the embodiment of the present invention is independent of the mechanism in any one of the TAP controllers 12, 13, 14, 15 for accessing functional logic, such as a CPU, for diagnostic or similar purposes. The mechanism may be via a diagnostic mode, as described above, or may be via one or more scan chains designed in some other way to carry diagnostic information. The only requirement is that each of the TAP controllers 12, 13, 14, 15 has a JTAG interface conformant with the standard, except as outlined below.

The multiplexer block 11 in FIG. 1 is designed to multiplex or demultiplex communications between the external pins 3-7 of the integrated circuit 10 and the four channels as will now be explained with reference to FIG. 2. FIG. 2 shows the multiplexer block 11 according to one embodiment of the present invention. The four input pins TCK, notTRST, TMS and TDI 3 to 6, which have already been described are connected to a bus 40. The bus 40 is connected to a 'multiplexed in' input 160 of a first multiplexer 41, and to one of two data inputs of a second multiplexer 42. The block marked 41 is in preferred embodiments of the invention is more that a simple multiplexer and contains synchronous (clocked) logic. The other parts of the multiplexer block 11 are purely combinatorial logic. The multiplexer 41 has state and memory and is the only part of the multiplexer block 11 to do so.

The other data input of the second multiplexer 42 is connected to the channel 0 output of the first multiplexer 41. The output of the second multiplexer 42 forms the channel 0 output from the multiplexer block 11 shown in FIG. 1. The external pins 8 and 9 provide optional additional control information to multiplexer 11 in certain modes, that is the bypass select signals 0 and 1 respectively.

The channel 0 input signal is fed to both the channel 0 input on the first multiplexer 41 and to one of the two data inputs of a third multiplexer 43. The other data input to the third multiplexer 43 comes from a 'multiplexed out' output 162 of the first multiplexer 41.

The first multiplexer 41 has another three channel outputs, channels 1, 2 and 3, which correspond to the output channels 1, 2 and 3 shown in FIG. 1. The three channel inputs, channels 1, 2 and 3 also correspond to the multiplexer block input channels 1, 2 and 3 shown in FIG. 1. In summary, the first multiplexer 41 has inputs for each of the four channels and outputs for each of the four channels. The first multiplexer provides a multiplexing and a de-multiplexing function. The channel outputs 1-3, although not shown are made up of the same signals as for channel 0, that is tmx_TCK(n), tmx_notTRST(n), tmx_TD(n). The channel n inputs to the multiplexer all comprise tmx_TDO(n).

It should be appreciated that in practice the Channel 1, 2 and 3 inputs are also connected to the input of third multiplexer 43.

The multiplexer 41 contains sequential logic and performs multiplexing according its internal state and clocked by TCK. Four additional multiplexers, 42, 49, 50 and 51, allow multiplexer 41 to be bypassed and operate by purely combinatorial logic. Multiplexers 44, 50 and 51 are associated with channels 1, 2 and 3 respectively and function in a similar way to multiplexer 42, as described previously. When multiplexer 41 is bypassed, only one of the multiplexers 42, 49, 50 or 51 may be set such that there is a single channel connected with the external pins 3-7.

In practice, the bypass described for channel 0 can be carried out for any of the other channels. There may in some embodiments be an exception to this. As will be described in more detail hereinafter one of the channels, channel 0, may be the default master. The default master is the channel selected after reset. This is because this channel contains the master TAP controller 12 for hardware testing. In different embodiments, a different TAP controller may act as the master TAP controller.

The bus 40 further provides the inputs of a four-input OR gate 44. In particular, the inputs to the OR gate 44 are the TCK, notTRST, TMS and TDI signals. The output of OR gate 44 is a reset signal and is connected via a de-glitch block 45 to one of the inputs of the first multiplexer 41 for reset purposes. It should be appreciated that whilst the reset condition is encoded on a plurality of signals which is decoded by OR gate 44, it is possible that this reset condition is accidentally decoded during otherwise legal transitions between signalling states on the signals received on pins 3-6, and this would be seen as a glitch, that is a very short duration pulse, on an otherwise stable decode of normal operation, being anything other than the reset condition. The de-glitch block 45 prevents such spurious glitches from accidentally causing a reset of multiplexer 41 during normal operation, by filtering pulses shorter than a specified duration.

The inputs to the logic block 46 are a bypass signal bypass_mode 47 from the first multiplexer 41, bypass selection signals 59 also from the first multiplexer 41, and a test scan mode signal tst_scanmode 48 used if the multiplexer block 11 is to be scan tested. Bypass selection signals are provided by three wires—one to indicate "select by sequence" and two more to indicate which channel. This will be discussed in more detail hereinafter.

The output of the logic block 46 controls the multiplexers 42, 49, 50 and 51 that are used to determine which one, if any, of the channels 0 to 3 are selected to bypass multiplexer 41.

Three further connections to the first multiplexer 41 are a scan test enable signal tst_scanenable 52 which is an output from the master TAP controller 12, a test scan input signal tst_scanin 53 and a test scan output signal tst_scanout 54, which are used if and when the multiplexer block 11 is required to be scan tested. A test control signal tst_rst_n on line 55 is connected to the multiplexers 42, 49-51 also for use during a scan test. It should be appreciated that in some embodiments of the invention these scan test signals may come from master TAP controller.

In one mode of operation, bypass mode, one channel may be selected by the channel selection input signals BYPASS_SELECT0 and BYPASS_SELECT1 which originate off-chip at the test equipment 2. To select one of four channels, a two bit signal is provided which provides four different binary signal combinations, 00, 01, 10 and 11. Using one of these four combinations, one of the four channels is selected. This control is used to select to which channel a connection is made by the multiplexer block for signals going to and/or from the respective TAP controller or device. The two bits providing the selection signal BYPASS_SELECT0 and BYPASS_SELECT1 are provided by respective input pins of the integrated circuit. In this mode, bypass mode, selection of the one channel by these input selection signals, known as "selection by pins", can be overridden by "selection by sequence" described next.

Also in the same mode of operation, bypass mode, one channel may be selected by the output of a finite state machine (FSM) indicated schematically as bypass selector 56 internal to multiplexer 41, the output of which depends upon a sequential signalling of the four input signals TCK, notTRST, TMS and TDI. In particular, the FSM is arranged to receive an "illegal" sequence of the four input signals. By illegal it is meant that the combination of the four input signals is not defined as in the JTAG standard and has no meaning in the context of the JTAG standard. This illegal combination of signals is used by the FSM 56 to put into such a mode that the next combination of input signals will define which of the channels is to be selected. In some embodiments of the present invention, one or more additional signal combinations will be required between the first illegal combination and the signal combination which defines the channel which is to be selected. The combination which is to select the channel required may also be an illegal combination of signals as may be any intervening signal combinations. This will be described in more detail hereinafter. The FSM 56 provides a two bit signal, "selection_by_sequence", which overrides "selection by pins" described previously.

In other words, some embodiments of the present invention will have selection by sequence only, some embodiments of the invention will have selection by pins and some embodiments will have both selection by pins and selection by sequence. Where both selection by pins and selection by sequence are provided, arbitration will be provided by logic 46 which receives the bypass select signals 0 and 1, and the bypass select by sequence signals. Depending on the implementation, one or other of the signals is give priority. Preferred embodiments have selection by sequence given priority over selection by pins.

It should also be appreciated that the number of bits required for the control signal for controlling the bypass mode will depend on the number of channels. Furthermore, in cases where external chip pins are at a premium, the bypass_ select pins 8,9 may be omitted entirely relying purely on "bypass by sequence" to select the one channel in bypass mode.

In embodiments of the present invention the host computer 1 may access, almost simultaneously, any of the devices such as CPUs 150, 154 and 158, for example, on-chip. This is achieved by the circuit of FIG. 2, the operation of which will now be explained in more detail, referring also to FIGS. 3 and 4.

Figure 3:
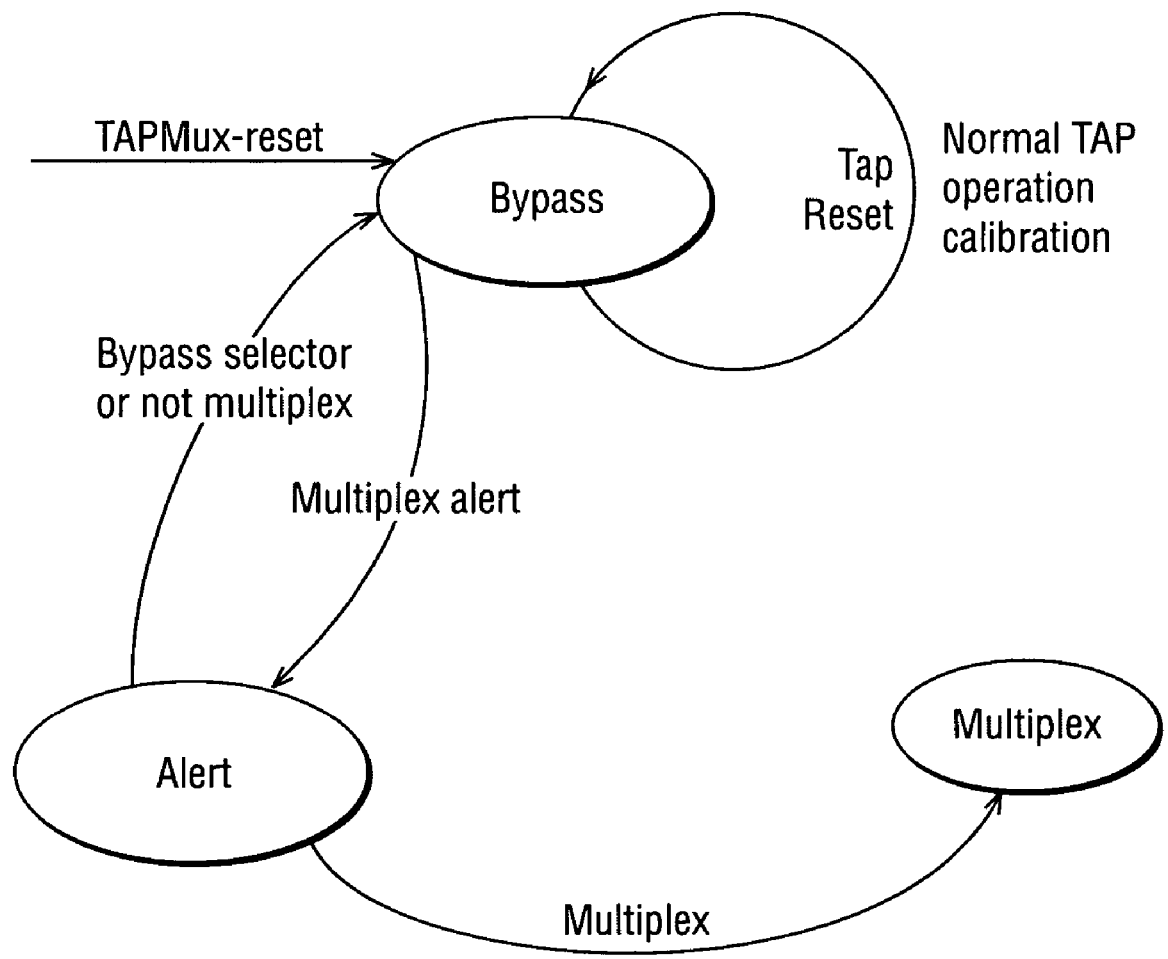
FIG. 3 illustrates the states and possible state transitions of an embodiment of the present invention.

A requirement of one embodiment is that the target chip may be tested according to the IEEE standard. According to the IEEE JTAG standard, the signal reset notTRST must be high for any operation to take place. FIG. 3 shows a state transition diagram according to an embodiment of the present invention and FIG. 4 shows the corresponding signals in a table. There are three states or modes of operation, Bypass Mode, Alert mode, and Multiplex Mode. It should be appreciated that in addition to these three operating modes, structural test is also supported. Following successful decode of the TAPMux reset condition, irrespective of any previous state, the bypass mode will be entered. The bypass signal 47 (FIG. 2—signal 47 is between the multiplexer 41 and logic 46) will go high, and the bypass_selection signal 59 for "select by sequence" will be inactive.

Referring to FIG. 2, when the bypass signal 47 goes high indicating that the bypass mode is to be entered, logic block 46 will cause multiplexers 42,43,49,50,51 to bypass the first multiplexer 41. The master TAP controller 12 on channel 0 is thus selected for all communication whilst in bypass mode, unless another channel is selected by means of the bypass select pins 8 and 9. The multiplexer block 11 will appear transparent and will not add any clock latency to either transmit data or to receive data.

For other modes of operation the system makes use of illegal signal combinations in the IEEE standard. A standard TAP controller, without the features of embodiments of the present invention, will be in a reset mode whenever the reset signal nTRST is low. In embodiments of the present invention, whilst the reset signal nTRST is low, other modes of operation may be entered. In the preferred embodiment shown in FIG. 3, the reset of the multiplexer block 11 occurs when all four inputs TCK, notTRST, TMS and TDI are low. This enables the reset notTRST input pin to be used for data when the system is not in multiplexer block reset, provided that all of the other three input pins are not low together. The reset of the multiplexer block 41 is implemented by the four-input OR gate 44 and de-glitch block 45. When the multiplexer block 11 reset occurs, i.e. all four inputs TCK, notTRST, TMS and TDI are low, the OR gate 44 causes the reset signal to go low, and the system returns to bypass mode.

Referring to FIGS. 3 and 4, the multiplexer 41 remains in bypass mode if the selected channel is reset, by asserting notTRST low, for normal TAP operation of the selected channel if nTRST is high, or if calibration is selected, by asserting notTRST low, TMS high and TDI high. If notTRST is low, TMS is low and TDI is high on the rising edge of the clock TCK, then the alert mode is entered. In the alert mode, the multiplex mode is entered if notTRST is low, TMS is high and TDI is low on the rising edge of the clock, otherwise if notTRST is high, the "select by sequence" channel is selected according to the state of TMS and TDI, and the multiplexer 41 returns to bypass mode. Once multiplex mode is entered, it remains until a valid reset is detected in which case bypass mode is entered.

In bypass mode, assuming first of all that there is no "selection by sequence" made by the FSM within the multiplexer 41, then the logic block 46 will allow the input pins 8 and 9 to select the channel. If no signals are provided on the input pins BYPASS_SELECT0 and BYPASS_SELECT1, maybe because the test equipment 2 cannot supply these signals, then a Master will be selected as the default device for test, which in this case is the first device 18 on channel 0. On the other hand, if signals are provided to the two input pins BYPASS_SELECT0 and BYPASS_SELECT1, then a channel will be selected that overrides the Master. Depending on the multiplexer settings, any combination of signals on pins BYPASS_SELECT0 and BYPASS_SELECT1 could select any of the channels, but in a preferred embodiment channels are selected as shown in the following table:

TABLE 1

| BYPASS_SELECT1 | BYPASS_SELECT0 | Input/Output Channel |
|---|---|---|
| 0 | 0 | 0 |
| 0 | 1 | 1 |
| 1 | 0 | 2 |
| 1 | 1 | 3 |

In bypass mode, with channel 0 selected, the chip may be structurally scan tested as defined by the IEEE JTAG standard. The test equipment 2 will provide the clock signal TCK, reset signal notTRST, TMS and test data in signal TDI, according the IEEE JTAG standard, to the respective input pins of the integrated circuit chip 10. These signals are passed to the multiplexer block 11, where they are fed to the 'multiplexed in' input of the first multiplexer via bus 40. The second multiplexer 42 receives a low signal at its control terminal from the logic block 46, thus selecting the channel 0 path from the first multiplexer 41.

Furthermore, in bypass mode, the test equipment 2 may provide input signals BYPASS_SELECT0 and BYPASS_SELECT1 to the respective pins of the integrated circuit chip, in order to select any one of the on-chip target devices for monitoring, configuration or diagnosis. Otherwise the default will be to select the master, in this case on channel 0.

In bypass mode, when diagnosis of a device on one channel is complete, a multiplexer block reset may be applied, and then a different channel may be selected for diagnosis using the input pins 8 and 9, the "select by pins" mechanism, or by using the "select by sequence" mechanism. Alternatively the same target device may be the subject of further diagnosis.

The diagram of FIG. 3 and table of FIG. 4 can be summarised as follows:

Regardless of the current mode the Bypass mode is entered if the all signals are low.

In the bypass mode, there can be TAP reset for selected channel, calibration or normal TAP operation for the selected bypass channel. This will depend on the values of nTRST, TMS and TDI on a rising TCK. The associated values are shown in FIG. 4.

The alert mode will be entered from the bypass mode if nTRST and TMS are 0 and TDI is 1 on the rising TCK.

From the alert mode, the multiplex mode can be entered if nTRST and TDI are 0 and TMS is 0 on the rising TCK. The bypass mode can also be entered from the alert mode. On a rising TCK, nTRST will be high and the values of TMS and TDI will define the channel.

In the multiplex mode, multiplex mode signalling will take place. It is only possible to leave the multiplex mode if all the signals are 0 and that means that the next mode is the bypass mode.

It should be apparent that diagnosis of any device on one of the channels, on a one at a time basis, does not allow for diagnosis of interactions between the devices on the separate channels. The multiplex mode allows for interaction between the external equipment and all available channels almost simultaneously.

In multiplex mode, up to four hosts 113,114,115,166 may be connected via an external driver 112, where each host is used to diagnose independently, but almost simultaneously, channels 0,1,2,3 respectively. This is described in more detail hereinafter with reference to FIG. 9.

Alternatively, in the preferred embodiment, in multiplex mode, a single host computer 1, may simultaneously diagnose all devices on the chip. This is particularly important where the interactions between the various on-chip devices need to be understood and coordinated, and this is best achieved using a single host managing all devices in concert. However, it should be appreciated that the development of the control software on the single host computer is considerable more complex that for separate hosts. For this reason, a further embodiment of the present invention which makes use of separate hosts and an external driver 112, is described first.

Figure 8:
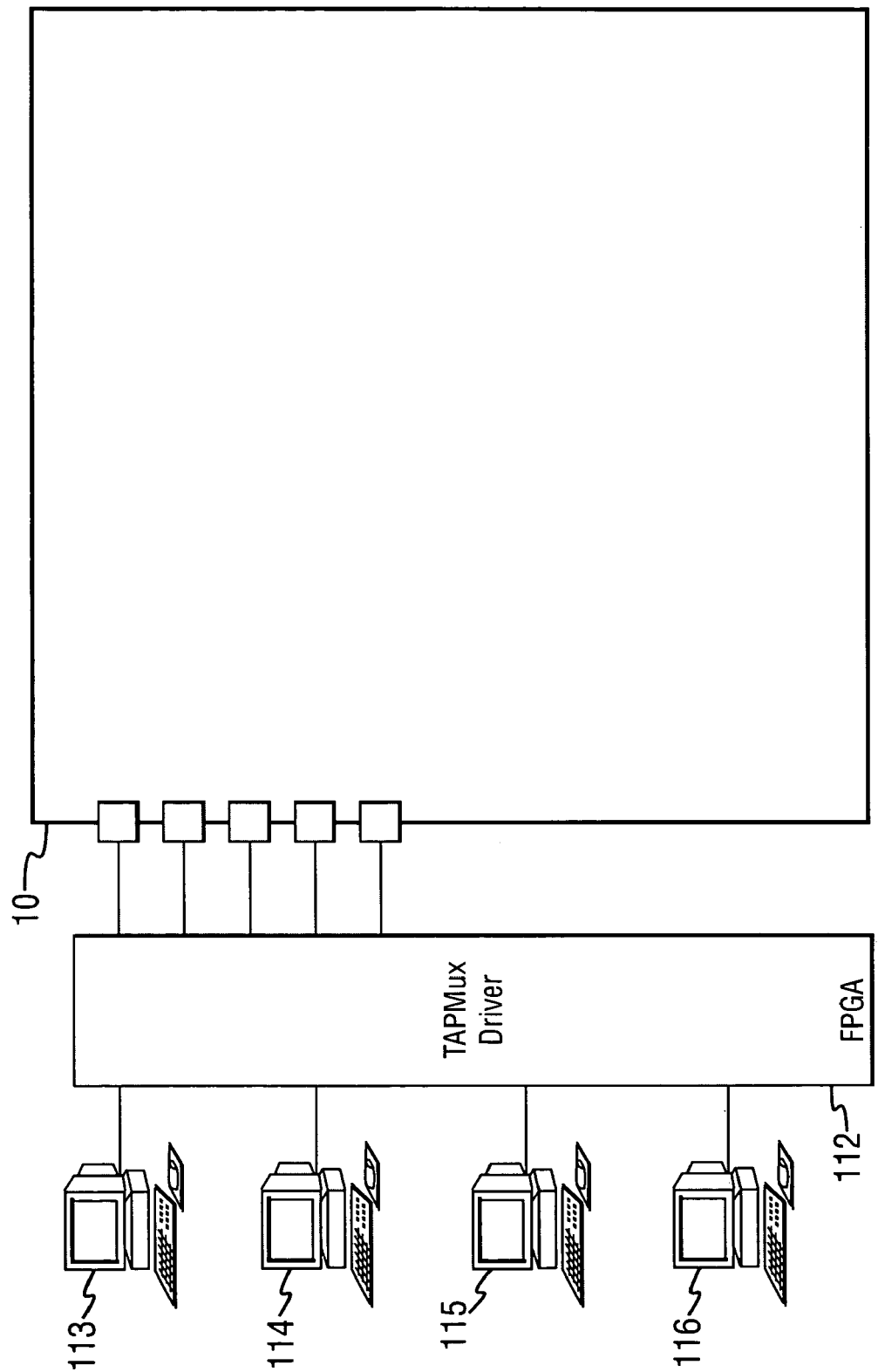
FIG. 8 illustrates schematically a test environment for testing devices on an integrated circuit board according to another embodiment of the present invention.

In this further embodiment of the present invention, more than one host may access the integrated circuit 10 in order to test a device, as shown in FIG. 8. FIG. 8 shows an integrated circuit 10, which is the same as integrated circuit 10 shown in FIG. 1, 11 and will not be described again. Off-chip, the test equipment has been replaced by a multiplexer block driver 112 designed to allow multiple host computers 113-116 access to the connection pins TCK, nTRST, TMS, TDI and TDO. Third-party test equipment would also be compatible with the integrated circuit.

So far circuits have been described for diagnosing target CPUs or target logic on the integrated circuit chip singularly. There is, however, a call for a method and circuitry that allows a number of targets to be diagnosed in unison and more particularly their interaction. According to the embodiment of the invention shown in FIG. 8, one, two, three or four of the targets 150, 154 158, 15 may be diagnosed at the same time by one, two, three or four of the hosts 113-116 respectively.

Figure 9:
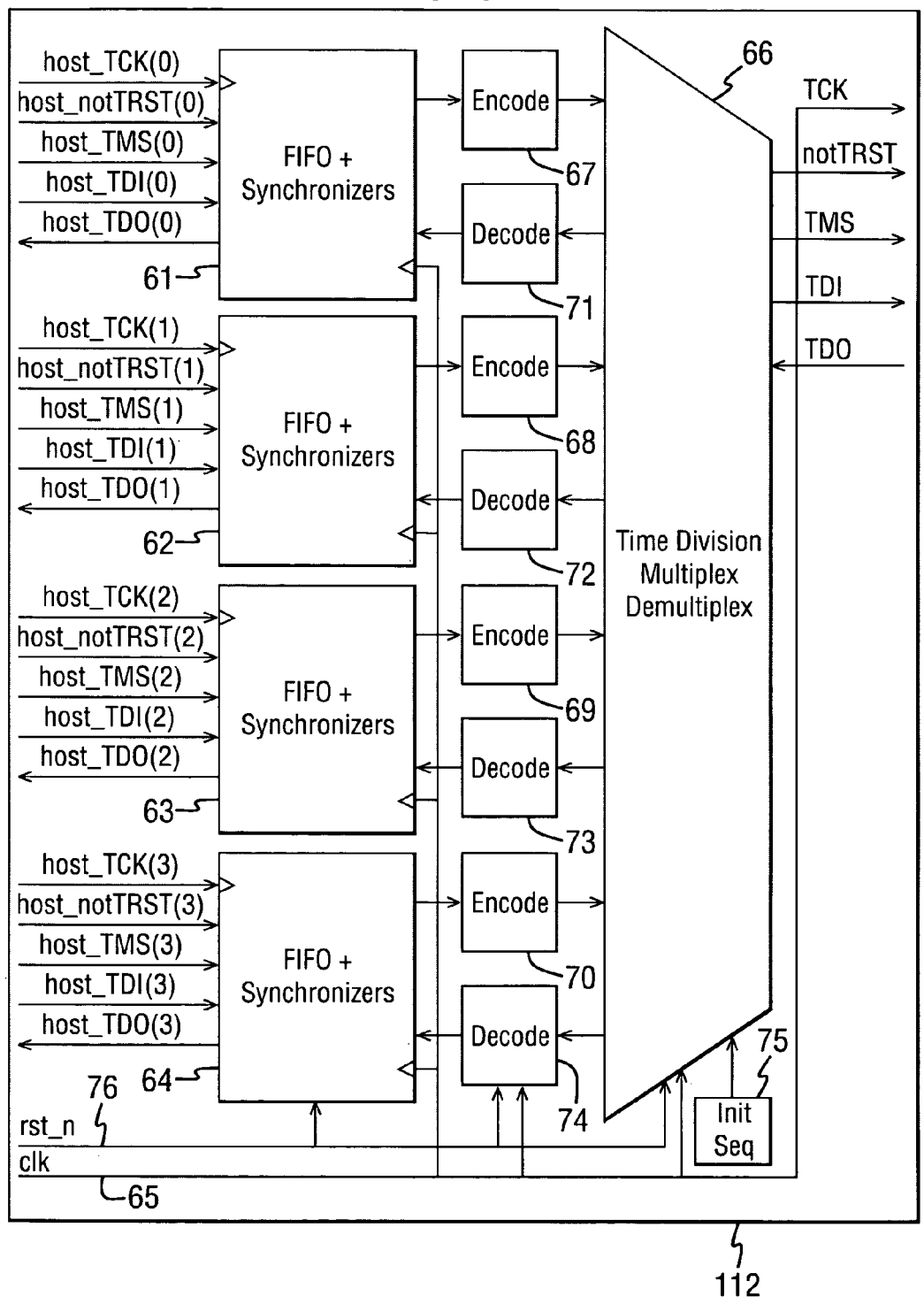
FIG. 9 shows the circuitry of the multiplexer driver of FIG. 8.

FIG. 9 shows the multiplexer block driver 112 according to an embodiment of the present invention. Four 'first in/first out' (FIFO) buffer and synchronizer blocks 61-64 each receive signals TCK, notTRST, TMS and TDI from their respective host 113, 114, 115 or 116 (shown in FIG. 8). Each also has a TDO output to their respective host. The FIFO synchronizer blocks 61-64 are clocked by a separate clock clk 65, and provide buffering and synchronization to the signals received from the host computers. A time division multiplex demultiplex block 66 receives signals from the FIFO synchronizer blocks 61-64 via respective encode blocks 67-70, and returns signals to each of the FIFO synchronizer blocks via respective decode blocks 71-74. The encode and decode blocks allow a coding scheme to be used for communications between the multiplexer block driver 112 and the multiplexer block 11 on-chip as will be explained in more detail later. The multiplex demultiplex block 66 outputs signals notTRST, TMS and TDI to the integrated circuit 10, and receives signal TDO from the integrated circuit 10. It also receives as controls a signal on line 75 from a block Init seq 164 which ensures that the multiplexer block 11 enters the multiplex mode following reset, a reset signal rst_n on line 76 and the clock signal clk 65. The clock signal clk 65 is also fed as a fourth input signal TCK to the integrated circuit 10.

The reset signal rst_n and clock signal clk are input to each of the FIFO synchroniser blocks and to each of the encode and decode blocks.

The multiplexer block driver 112 performs a number of functions. Primarily it performs time division multiplexing of the input signals from hosts 113-116 onto the output lines notTRST, TMS and TDI. For example, if host 113, host 114, host 115 and host 116 wish to access channels 0, 1, 2 and 3 respectively, then the four TDI signals from the four hosts are required to be time multiplexed onto the single output TDI. The available bandwidth on the output line TDI could be divided giving one host a greater share of the bandwidth than another host. For example host 113 may have access to half of the available bandwidth on the TDI connection. Host 114, 115, and 116 may each have ⅙ of the bandwidth on line TDI for signals that will be multiplexed to channels 1, 2 and 3 on the integrated circuit 10 respectively. The same time multiplexing will be applied to the output signals nTRST and TMS from the multiplexer block driver 112.

The time division multiplexing is advantageous in that it provides flexibility and allows the synchronising of channels. By using the slots, it is possible in some embodiments of the present invention to avoid the need for channel tags which would indicate the channel for which the data is intended. This is because it can be determined that if the data is in slot n, then the data must be channel x and so on. This means that bandwidth is not overloaded with channel information tags or the like.

It should be appreciated that the share assigned to each channel can be changed depending on how much of the bandwidth is required by the current diagnostic conditions. The multiplexer block driver 112 also performs time division demultiplexing of the input signal TDO from the integrated circuit 10. TDO will be sent to the required host having been decoded by one of the decode blocks 71-74 and being passed through one of the FIFO synchronizer blocks 61-64.

Figure 10:
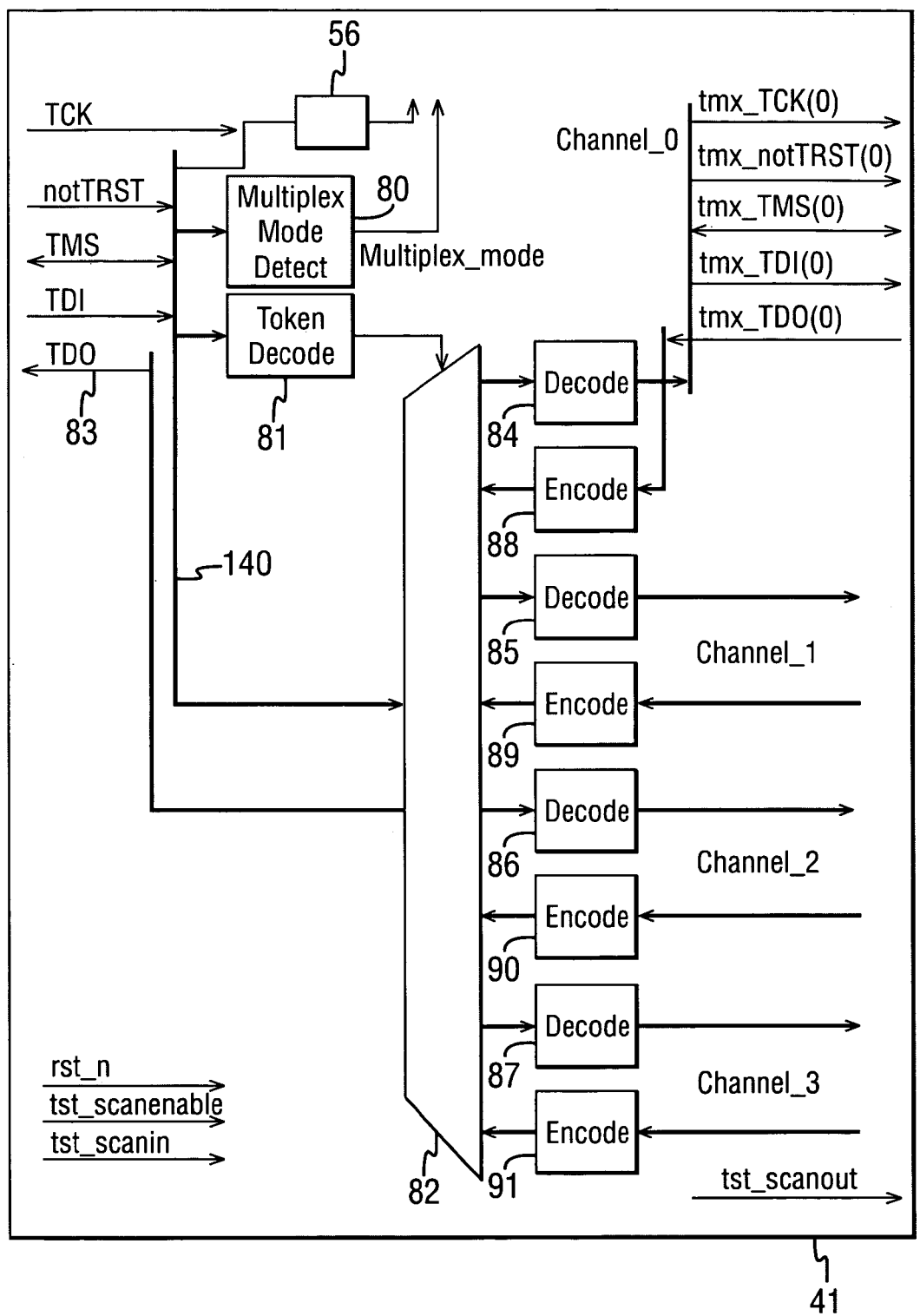
FIG. 10 shows the circuitry of the multiplexer block of FIG. 9.

FIG. 10 shows the multiplexer block 41 in more detail. This block receives the signals TCK, notTRST, TMS and TDI from the multiplexer block driver 112 in the embodiment shown in FIG. 9. It should be appreciated that the multiplexer block 41 of FIG. 10 can be used in the embodiment of FIG. 1. The signals TCK, notTRST, TMS and TDI are connected via a bus 140 to a multiplex Mode Detect block 80, a Token Decode block 81 and to a Time Division Multiplex/Demultiplex block 82. An output TDO from the multiplex/demultiplex block 82 is fed to the output line 83. The multiplex/demultiplex block 82 performs time division demultiplexing of the signals from input pins notTRST, TMS and TDI onto output respective output lines on channels 0, 1, 2 and 3. The output to each of the four channels is decoded by one of the four decode blocks 84-87, and the inputs to the multiplexer block from each of the four channels is encoded by one of the four encode blocks 88-91. The multiplexer block 82 also performs multiplexing of the signals received from channels 0, 1, 2 and 3, this output being fed off-chip to the multiplexer block driver via the output pin TDO. Channel 0 is shown with separate signals. Channels 1-3 have same structure but this is not shown.

Figure 7:
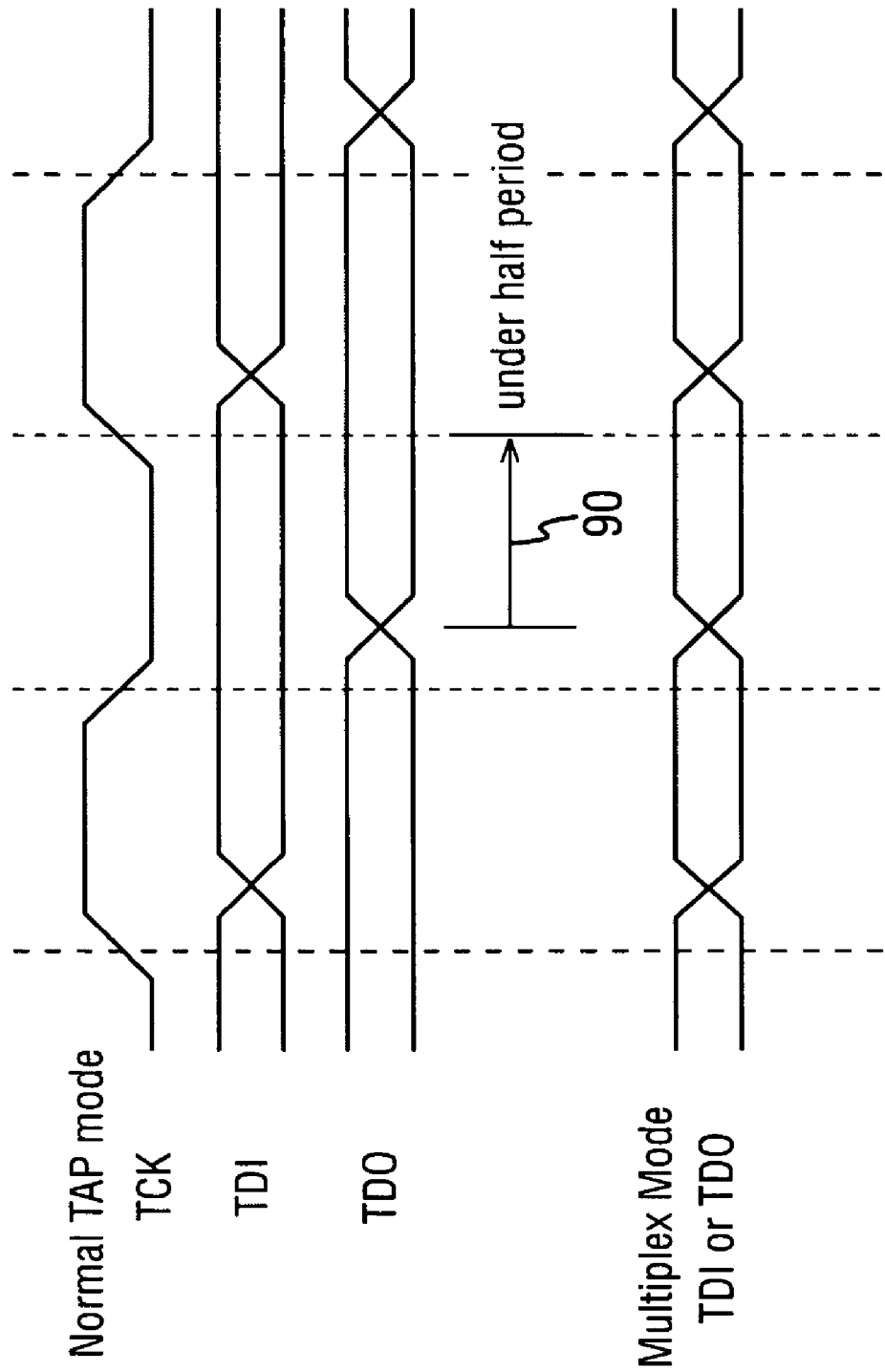
FIG. 7 shows a timing diagram illustrating double rate data transmission used in embodiments of the present invention.

Whilst in the multiplex mode, data between the multiplexer block driver and the multiplexer block 11 may be sent at twice the data rate from the rate defined by the IEEE Standard 1149.1 1990. Reference is made to FIG. 7 which shows a timing diagram for signals in normal TAP mode, and in multiplex mode. According to the IEEE 1149.1 JTAG Standard, only a half-period is allowed for the return of TDO data to the host, before it is clocked by the test clock TCK, as shown by arrow 90. Therefore, without imposing any tighter restrictions on the connectivity between the test equipment and the target, data (TDI or TDO) can be clocked on both the rising and the falling edge of TCK. Circuitry for implementing this feature is shown in FIG. 12*a*.

Figure 12A:
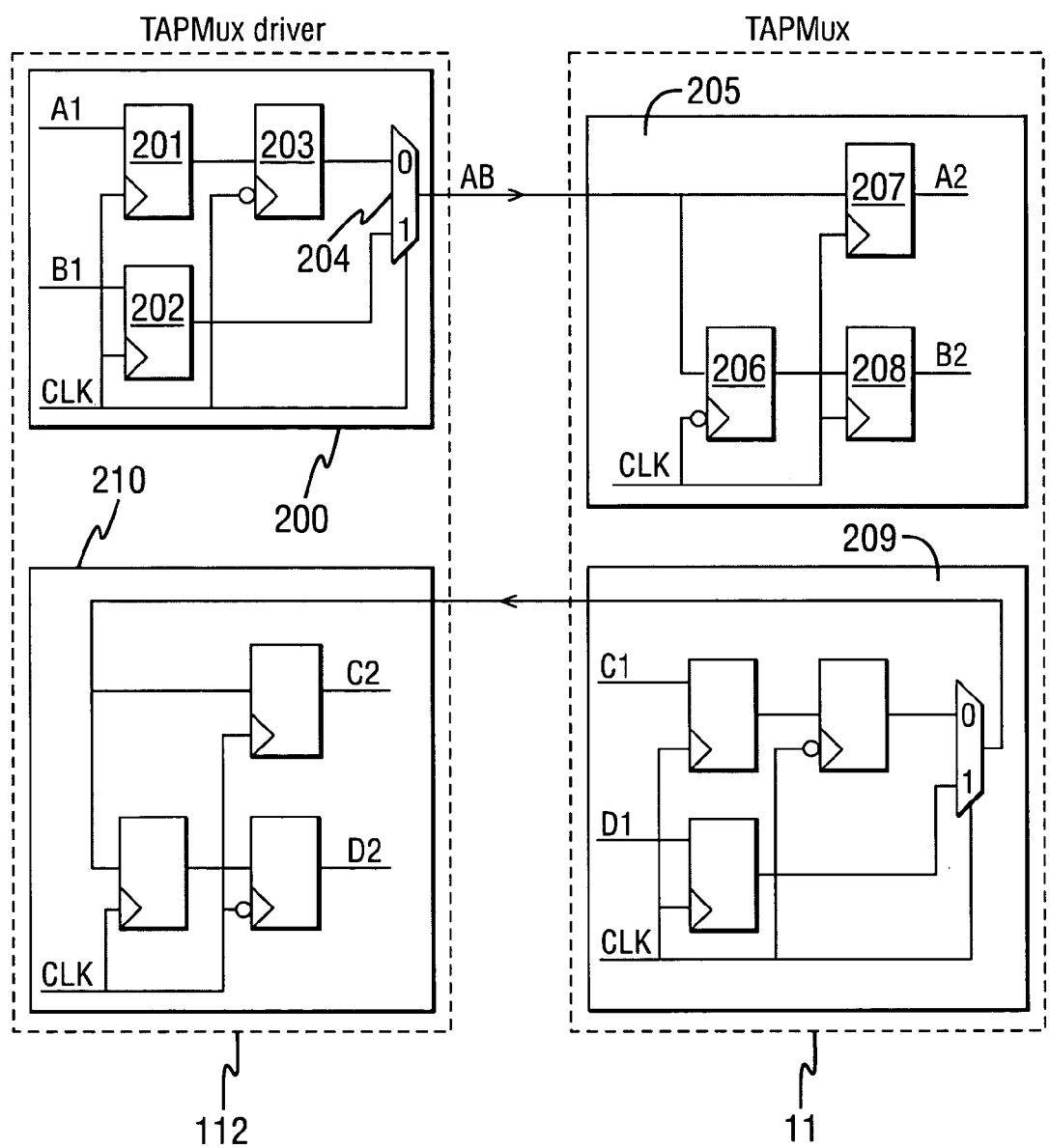
FIG. 12a shows circuitry for implementing double rate data transmission in embodiments of the present invention.

FIG. 12*a* shows circuitry that could be incorporated in the multiplexer block driver and the multiplexer block respectively in order to clock data at twice the normal rate. Block 200 is circuitry that combines two data lines A1 and B1 onto a single line AB. The signal AB represents a signal where for half a clock cycle, the signal is defined by the data on data line A1 and the following half clock cycle, the signal is defined by the data on data line B1. Data on lines A1 and B1 represent one of the signals TDI, TMS or notTRST from two of the host computers, which is destined for two of the target devices on-chip. Line A1 is connected to the data input of a first D-type flip-flop 201, and line B1 is connected to the data input of a second D-type flip-flop 202. Each of the flip-flops 201, 202 has a clock input, connected to a common clock signal clk signal. The output of the first flip-flop 201 is connected to the data input of a third flip-flop 203, which is clocked by the falling edge of the same clock signal clk. The outputs of the second and third flip-flops 202,203 are connected to the two inputs of a multiplexer 204, the output of the multiplexer 204 forming the signal AB to be sent on one of the lines to the integrated circuit board. In this embodiment the multiplexer 204 is controlled by the clock signal clk.

Block 205 splits the signal on line AB back into two separate signals A2 and B2 to be sent to selected target devices. Line AB is connected to the data inputs of first and second D-type flip-flops 206 and 207. Both the first and second flipflops 206,207 have clock inputs connected to a common clock signal clk, but the first flip-flop 206 is clocked by the falling clock edge, and the second flip-flop 207 by the rising edge. This is achieved in that the first flip flop 206 receives the inverse of the clock signal while the second flip flop 207 receives the clock signal, not inverted. The output from the first flip-flop 206 is connected to the data input of a third D-type flip-flop 208, which is clock by the positive edge of clock signal clk. The outputs A2 and B2 from the first and third flip-flops are delayed versions of the inputs on lines A1 and B1.

Data on lines C1 and D1 represents the return signal TDO from two of the target devices on-chip, destined to two of the host computers. Block 209 performs in the same way as block 200 described above, having the same structure and function. Block 210 performs in the same way as block 205 as described above, having the same structure and function. The outputs C2 and D2 are delayed versions of the signals C1 and D1.

Figure 14:
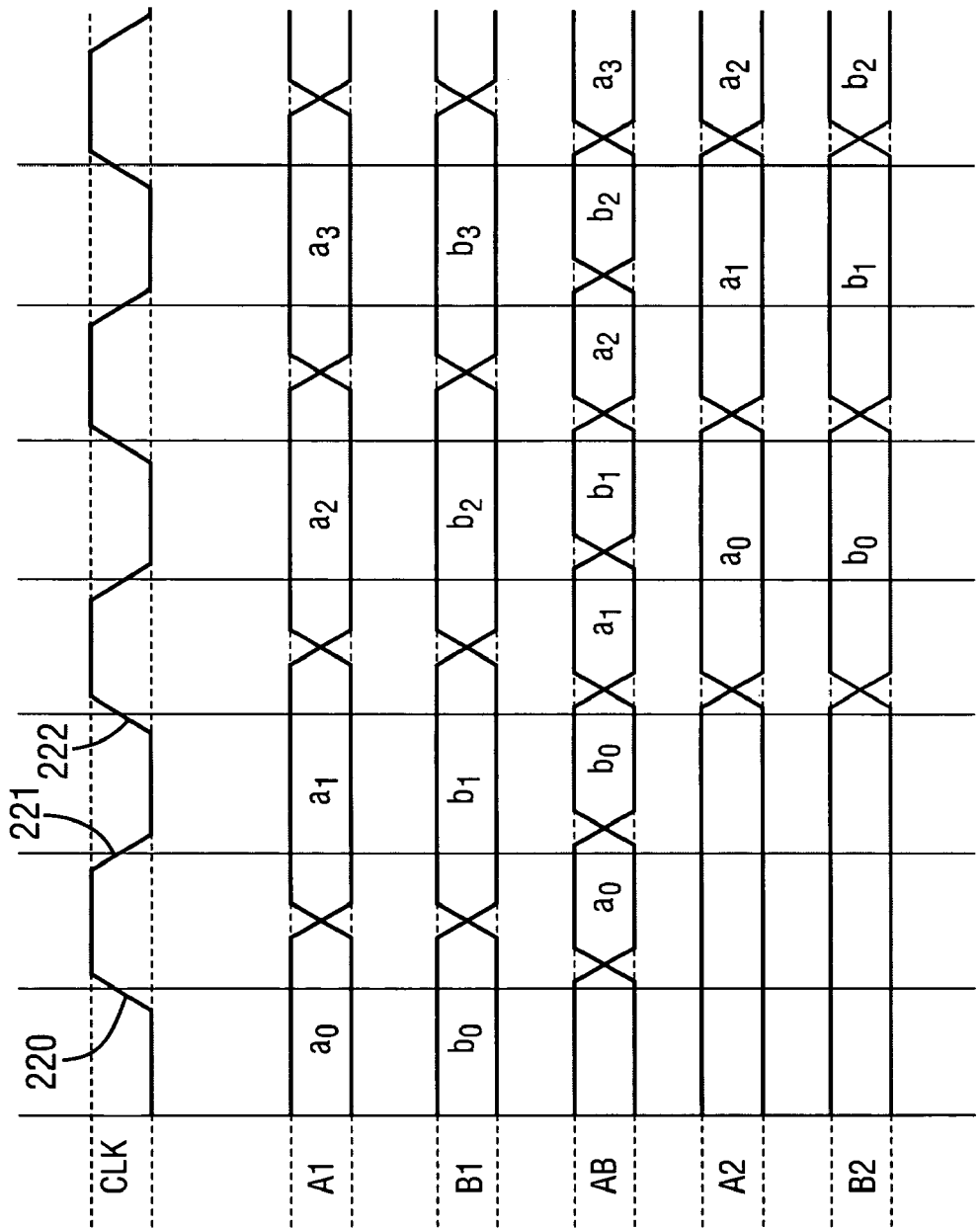

The operation of the circuitry in FIG. 12*a* will now be described with reference to the timing diagram shown in FIG. 14. The timing diagram shows the clock signal and the signals on lines A1, B1, AB, A2 and B2 respectively. Propagation delays between the multiplexer block driver and the multiplexer block have been omitted for clarity. The signals on lines A1 and B1 consist of data a0, a1, . . . and b0, b1, . . . respectively as shown. Line B1 is clocked by flip flop 202 on the rising clock edge 220 of the clock signal CLK, and whilst the clock signal CLK is high data b0 is output from the multiplexer 204 on output line AB. Line A1 is clocked by flip flop 201 on the rising edge 220 of the clock signal CLK, and this output is then clocked again by flip flop 203 on the falling edge 221 of the clock signal CLK. When the clock signal CLK is low, multiplexer 204 outputs data a0 on the line AB and when it is high data b0 output.

The receiving block 205 then operates as follows. Line AB is clocked by flip flop 207 on the rising edge 222 of the clock signal CLK. Therefore the data a0 is output shortly after the rising clock edge 222 on line a2. The signal on line AB is also clocked by flip flop 206 on the falling edge 221 of the CLK signal, and this output is again clocked by flip flop 208 on the rising edge 222 of the clock signal CLK. Therefore the data b0 is output on line b2 shortly after this clock edge.

Figure 13:
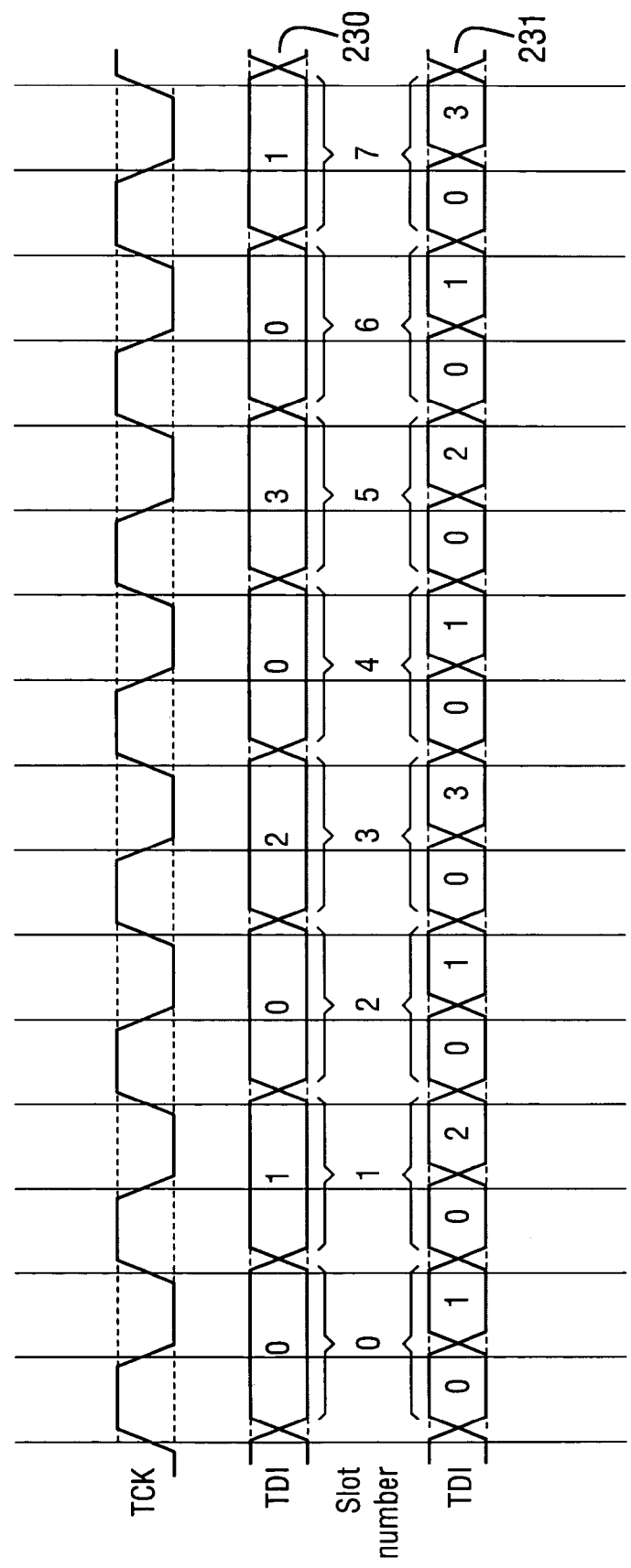
FIG. 13 shows a timing diagram with two possible formats for data signals.

FIG. 13 shows two possible formats of data signals 230 and 231 between the multiplexer block driver 112 and the multiplexer block 11 which can be used in different embodiments. TCK is the test clock signal used to clock the data at the multiplexer block. The signal 230 shows that according to an embodiment one data item for a particular channel could be sent to the multiplexer block 11 during each clock period. Each data item is assigned a slot number, eight slots making up a frame. In this way, without the need for extra control signals, the destinations for each of the slots in a frame can be allocated once, and then remembered for subsequent frames. It should be appreciated that in alternative embodiments of the present invention the slots can be allocated on a frame by frame basis or every n frames or any combination of these described options.

Preferably data is sent at double the data rate as described above, shown by signal 231. In this case a frame consists of sixteen half-slots, each allocated to a particular channel. The embodiments of the present invention are arranged to provide signalling at double the data rate but without increasing the bandwidth or the critical timing paths.

Operation whilst in Multiplex mode will now be described. The Multiplex mode detect block 80 shown in FIG. 10 detects the combination of signals required to enter Multiplex mode via alert mode as shown in FIGS. 3 and 4. The signal 'Multiplex_mode' is used to direct all communications on bus 140 via a Multiplex block 82, and also all communications from channels 0, 1, 2 and 3 via the multiplex block 82. The token decode block 81 decodes tokens received from the multiplexer block driver block 112.

A token coding scheme is implemented in a preferred embodiment of the invention, in order that control signals for controlling the multiplexer block 82 can be sent from the multiplexer block driver block 112, as well as the normal test signals, without the requirement for additional pins.

Figure 15:
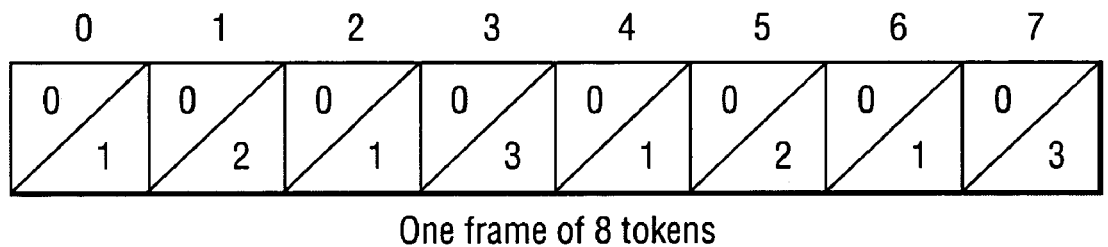
FIG. 15 shows a frame of 16 half-slots.

FIG. 15 shows a preferred scheme in which a frame consists of 8 tokens received in series. Each token is divided into two half tokens. Each half token may be allocated to a particular channel 0 to 3. In the example shown, channel 0 is allocated half of the available half-tokens, equivalent to half of the available bandwidth. Channel 1 is allocated one quarter of the available half-tokens, equivalent to one quarter of the available bandwidth. Channels 2 and 3 are each allocated one eighth of the available half-tokens, equivalent to one eighth of the available bandwidth per channel. It should be appreciated that in preferred embodiments of the present invention, the two half tokens making up each token are allocated to different channels. It should be appreciated that the division of the channels between the tokens is by way of example only and different divisions of the channels between the tokens can be used, depending of the relative bandwidths required by the different channels. It should be appreciated that the allocation of tokens to respective channels in the frame can be the same from frame to frame as mentioned above or can be changed dynamically. It should also be appreciated that no data can be transferred for a particular slot whilst its allocation is changed, noting that in one embodiment, the slot in one frame is required to deallocate the slot and a slot in a further one frame is required to allocate the slot to another channel.

FIG. 11 shows an encoding scheme implemented by an embodiment of the present invention whilst in multiplexer mode. The left-hand half of the table 240 shows the encoded six bits of a token. The right-hand half of the table 241 shows the decoded output to be sent to one or more of the channels 0-3, and the significance of this output. A token consists of six bits, received on lines notTRST, TMS and TDI. The first three bits of a token are received on the falling edge of TCK and second three bits are received on the rising edge of TCK.

The first line 242 in the table shows that whenever zeros are captured on the rising edge of TCK for all three of the inputs, Multiplexer block reset is performed. This implies that all of the output signals to the four channels are low.

The five lines 243 of the table show combinations that are not used in this embodiment but could be allocated to different functions.

The lines 244, 245 are relevant if a particular half slot is not already allocated to a channel. Preferably a channel allocation register stores the allocated channels for each of the 16 half-slots in an 8 token frame. Using the system of frames, both the multiplexer block on-chip and the multiplexer block driver off-chip are aware at what point within a particular frame they are at any point in time during communication. Therefore, as the multiplexer block receives each half-token in a frame, it is able to verify whether or not that particular half-slot has been allocated to a channel by referring to the area within the channel allocation register assigned to that slot. If a channel has not been allocated, and if notTRST is high, the values sent on lines TMS and TDI indicate the desired channel for that particular half-slot. The two bits C1 on line TMS and C2 on line TDI designate a channel as shown in the following table:

TABLE 2

| C2 | C1 | Input/Output Channel |
|---|---|---|
| 0 | 0 | 0 |
| 0 | 1 | 1 |
| 1 | 0 | 2 |
| 1 | 1 | 3 |

The same scheme is used for the first half and the second half of each slot. Lines 244 and 245 are not used if a slot has been allocated.

Lines 246-249 in the table show the significance of the received signals when a half-slot has been allocated to a channel. Whilst notTRST is low, the target devices can be reset (notTRST on each channel made low) by asserting TMS high and TDI low.

Whilst notTRST is low, half-slots may be deallocated channels. The channel for a current slot can be deallocated by asserting TMS and TDI high, as shown on line 248 of the table. When this is implemented, the channel allocation register will be updated, and the next time data for that slot is received (with notTRST high) the values of TMS and TDI will allocate a new channel.

When a half-slot has been allocated, and notTRST is high, the signals TMS and TDI, labelled M and D on line 249 of the table, are used for the data associated with the test. Data is received on both the falling and rising clock edges of the clock signal TCK. This data is outputted to channels on the rising clock edge of the clock signal TCK. As mentioned above, in embodiments of the invention, the two half-slots of a token may not be allocated to the same channel, as output data to a channel may only be clocked by the rising edge of the clock signal TCK, and therefore not at the double rate at which it is received.

A requirement of the system is that each target device on chip is diagnosed at the same time. However, if the clock signal TCK is transmitted on each of the channels, for periods when a particular channel is not allocated to a slot, erroneous zeros would be clocked by the target device. To avoid this, the clock signal TCK is divided between the channels, such that only when data is available will the target device clock data. Whilst there is no data available for a particular channel, the clock signal TCK will not be asserted, and therefore the device will remain in an idle state awaiting the next clock signal.

Referring back to FIGS. 9 and 10, the encode and decode blocks 67-74 in FIG. 9, and the encode and decode blocks 84-91 in FIG. 10 perform the encoding and decoding of signals as described above.

In a preferred embodiment of the present invention, an over-sampling technique is used during all communication between the test equipment or multiplexer block driver and the multiplexer block or multiplexer block 2 block on-chip, as will now be described.

A solution using over-sampling are discussed in more detail in co-pending European Patent Application EP 01307925.6, which is hereby incorporated by reference.

The use of over-sampling in the present invention will now be described with reference to FIGS. 5 and 6. Oversampling logic is used to counter the effects of the delay loop between the test equipment and the TAPMux, without requiring a reduction in the clock frequency. Oversampling is where for any given period of time more samples of the desired data are captured than are required and only the data sample or samples which have been determined to be valid are passed on to subsequent logic.

Figure 5:
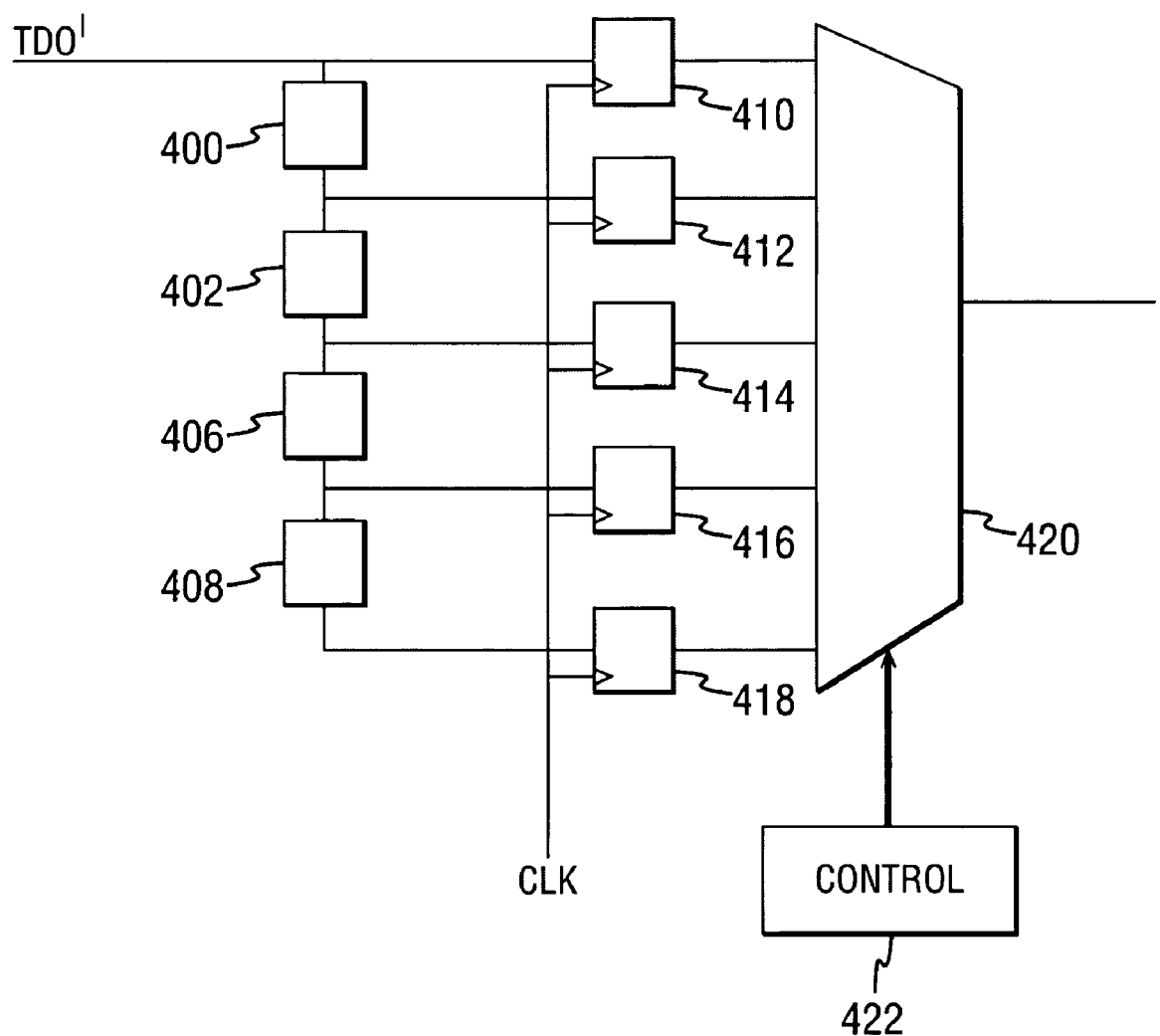
FIG. 5 illustrates schematically oversampling circuitry incorporated in an embodiment of the present invention.
Figure 6:
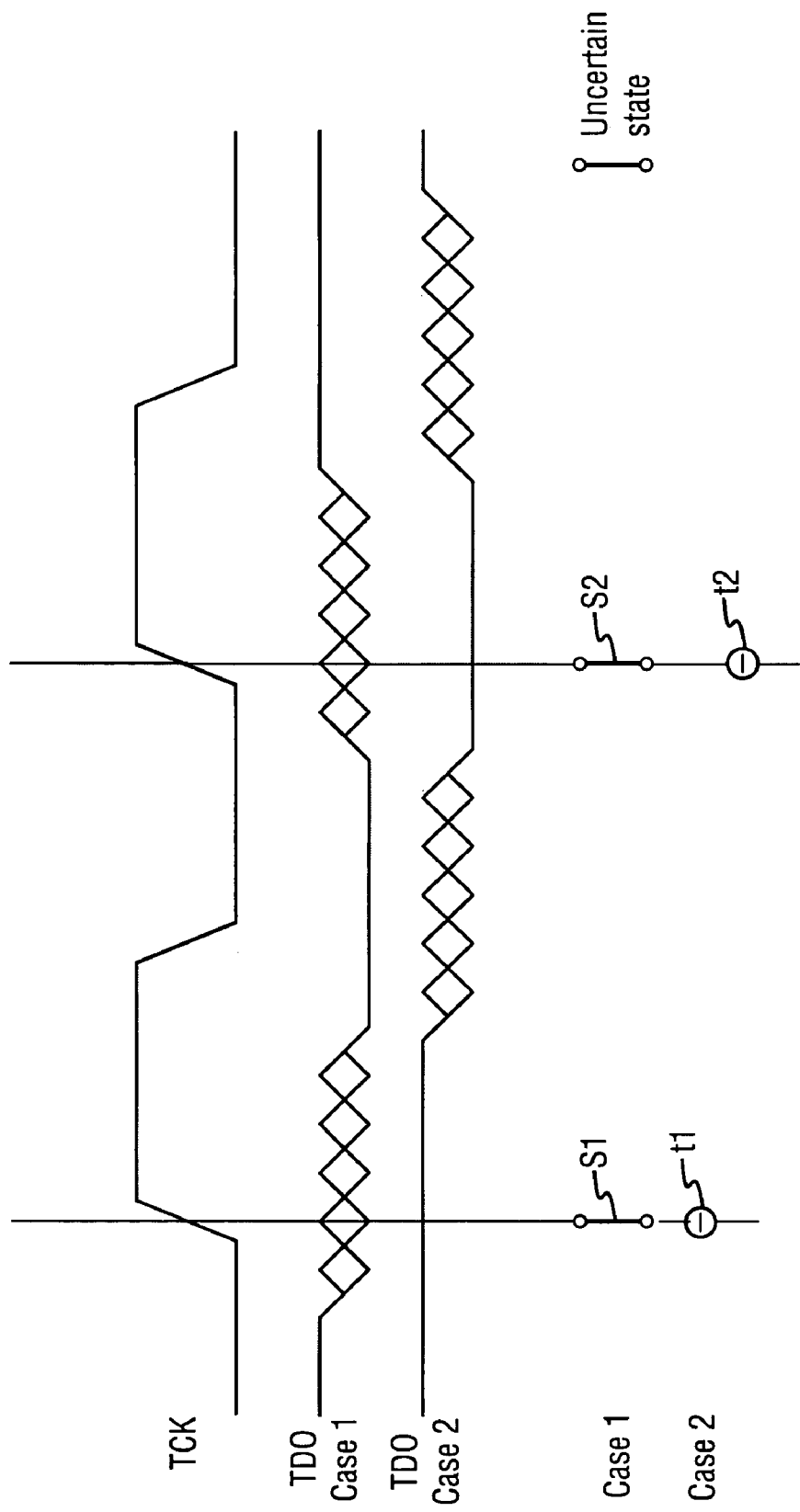
FIG. 6 shows timing diagram for two outputs of the arrangement of FIG. 5.

Reference will now be made to FIG. 5 which shows circuitry for oversampling according to one possible embodiment. The circuitry shown in FIG. 5 is incorporated in the test equipment. The TDO signal received at the test equipment is fed into a chain of delay elements 400-408. Each delay element has an output connected to a respective flip-flop 416-418. Additionally there is a further flip-flop which has an input from an un-delayed version of the TDO signal. Thus each flip flop receives the TDO signal with different amounts of delay. Each flip-flop 410-418 has their respective output connected to a multiplexer 420. The multiplexer 420 is controlled by a controller 422 which selects one of the versions of the TDO to be output. The control circuitry may comprise edge detection circuitry for determining the version of signal TDO to be output, be provided by software or may be provided by manual calibration. In a calibration mode, a known sequence of data is applied and the output is considered. Effectively a trial and error process is carried out to determine which is the appropriate version of TDO.

The delay elements may take any suitable form and may for example comprise two inverters in series or any other suitable circuitry.

In an alternative embodiment, the TDO signals may be input to a series of flip-flops, with none of the TDO signals being delayed. Instead, the clock signal which is input to the flip-flops will each have a different delay. The outputs of the flip-flops would be output to a multiplexer which would have similar control circuitry as already described.

The principle behind the embodiment of the invention and the modification described will now be discussed in relation to FIG. 6.

The function of the edge detector 440 will now be explained with reference to FIG. 6. FIG. 6 shows a test clock signal TCK.

The test data TDO' received at the test equipment may have a transition sometime within a clock cycle of the test clock signal. Case 1 represents test data which has a transition during one part of a clock cycle and case 2 represents test data which has a transition during another part of the clock cycle. Case 1 represents one version of TDO input to a flip flop in FIG. 5 and case 2 represents another version of TDO input to a flip flop in FIG. 5, with a different delay. The part of the signals TDO marked with hatching represents that part of the signal where there is uncertainty as to whether the value of the has changed. In embodiments of the invention there may only be two cases or as illustrated in FIG. 5 there may be more than two cases. The number of cases in a matter of design choice and may be any suitable number equal to two or more.

The oversampling for each of these two cases is illustrated. In this example, it is assumed that data is read on the rising clock edge. In alternative embodiments of the invention, the data may be read on the falling clock edge or on both the rising and falling clock edges. In the case of the case 1 a first sample S1 is taken on the rising edge of the TCK signal. At this point, there may be a transition and so the data cannot be read with certainty. This is also true for the second sample read at the next clock edge. It should be appreciated that the number of samples which are taken is a matter of design choice.

The sampling for the second case is illustrated and samples are taken at the same time as for the first sample. For the first and second samples t1 and t2, the results can be validly read.

Thus the output of the multiplexer would be selected to be case 2 data. The control unit 422 would select the case 2 version of TDO to be output. It should be appreciated that alternative embodiments of the present invention can use any other suitable method for determining which version of the TDO to output. For example, a double rate clock may be used with double data rate cases. In this case samples being taken on each rising and falling edge being taken. This allows the appropriate case of TDO to be output. It should be appreciated that this can be applied in an analogous way to the version of this embodiment which uses delayed versions of the clock signal.

The procedure carried out by the edge detector, calibration or the like used by the control unit 422 determines if the data received TDO' falls into the category defined by the first case or into the category defined by the second case. In some embodiments, the clock signal to be used can be determined. For example some systems may use the clock signal TCK and its inverse. It can be determined which of these clock signals to use. In this latter modification, it would be necessary to take samples on the falling edges of the clock signal as well as the rising clock edge to identify the appropriate version of data and the appropriate clocking edge of the clocking signal.

Figure 12B:
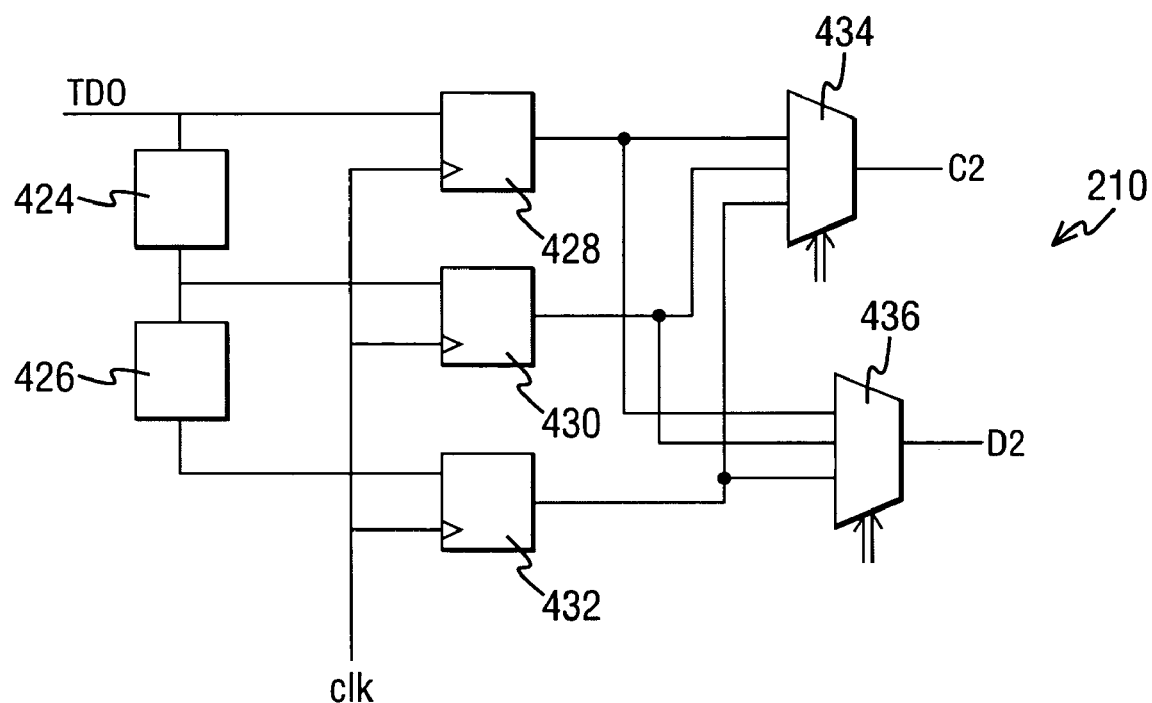
FIG. 12b shows a modification of part of the circuitry of FIG. 12a to incorporate oversampling.

Reference is made to FIG. 12b which shows the embodiment of FIG. 12a modified to include oversampling. In particular block 210 has been modified and this is shown in FIG. 12b. In this arrangement, TDO is input in an undelayed form to the first flip-flop 427. TDO is then input to a chain of delay elements comprising a first delay element 424 and 426. An output of each of the delay elements is input to second and third flip-flops respectively. In other words each of the three flip-flops receives a version of TDO with a differing amount of delay. Each of the flip-flops also receives the same clock signals. Each of the flip-flops provides an output to a first multiplexer 434 and to a second multiplexer 436. The first multiplexer provides output C2 and the second multiplexer provides output D2. It should be appreciated that appropriate control circuitry (not shown) is provided to control which flip-flop output is provided as an output of the multiplexer circuitry. It should be appreciated that in some embodiments more than two delay elements and three flip-flops may be provided. The alternatives described in relation to FIG. 5 may also be applied here.

In the preferred embodiments of the present invention shown in FIGS. 1 and 8, the TAP controllers and multiplexer block 11 are fully scan testable. In particular embodiment of the invention, the multiplexer block 11 supports scan testing. For scan testing, the signals for scan testing need to go through block to be tested. The logic in the TAP multiplexer 11 can be considered to be bypass combinatorial logic and sequential logic. The bypass combinatorial logic is marked 157 in FIG. 2 and comprises deglitch block 45, logic 46, multiplexers 42 and 42 and OR gate 44. The sequential logic is provided by multiplexer 41.

In the test scan mode, signals input via pins 3 to 7 are connected to the master TAP controller via the bypass combinatorial logic. The master TAP controller is used to hardware test the logic 154, 158 etc. In other words the TAP controllers 13-14 are not used, only the master TAP controller.

In particular, one of the TAP controllers is defined as the master TAP controller. Preferably the master TAP controller performs the structural test (in addition to debug of a particular CPU), and is connected to channel 0. Referring to FIG. 2, the signals tst_scanmode, tst_scanenable, tst_scanin and tst_rst_n are fed to the TAPMux block 11 from the Master TAP controller 12. When the signal scan_mode is asserted high, scan mode is entered.

When scan_mode is asserted, the bypass logic causes the second and third multiplexers 42,43 to divert the input signals from the input pins directly to channel 0, and the return signal from channel 0 to the output pin TDO.

During scan mode, the other TAP controllers act as secondary TAP controllers, which are also structurally tested by the master TAP controller 12, are connected according to the table shown in FIG. 16. The first section 250 of the table shows that the pins TCK, notTRST, TMS, TDI and TDO are connected to channel 0, as described above. The other sections 251-253 show the connections to channels 1, 2 and 3 respectively. Each channel still receives the clock TCK. In each channel 1, 2 and 3, notTRST is connected to the input signal tst_rst_n 57. The lines TMS and TDI to each channel and the TDO return line from each channel remain connected from the internal functional path and are also structurally tested.

During the structural test, the multiplexer block 11 is effectively isolated so that its structure may be tested. In other circuits, once the test has been completed, a structural test reset is performed.

A problem might occur during power-up however, if the integrated circuit (chip) is powered up in scan test mode.

Embodiments of the present invention solve this problem by defining a priority order. The TAP multiplexer Reset is given highest priority, so that if the chip powers up in scan test mode, a TAP multiplexer reset will cause the scan test mode to be exited. This means that TAPMux reset is not tested during the structural test. The priority order is as follows:
1. TAPMux Reset
2. Structural Test Mode
3. Multiplexer Mode
4. Selection by Sequence
5. selection by Pins It should be appreciated that all of the multiplexer 41 is asynchronously reset on TAPMux reset. The TAPmux reset not derived from single input but rather from a combination of inputs 3-6. In embodiments of the invention, it is ensured that decode logic 44 (OR gate) does not have state. To ensure that all states are correctly asynchronously (without requiring clocking) reset, this is achieved by assertion of signal tmx_notTRST in the low state. In some embodiments of the invention, the signal tst_rst_n can be generated by the master TAP controller or by the external testing circuitry. The master TAP controller can thus receive scan test signals via the bypass logic. To test the multiplexer 41, the master TAP controller can provide scan test signals to the multiplexer 41. Additionally the scan test signals may be provided to the bypass logic.

Within the multiplexer mode described above, there are two types of data transfer, transparent data transfer and pipelined data transfer. These types of data transfer do not affect the operation of the TAP multiplexer block but can have implications as to the operation of the external equipment. In the following, the operation of the external.

TAP multiplexer driver will be described.

Figure 17A:
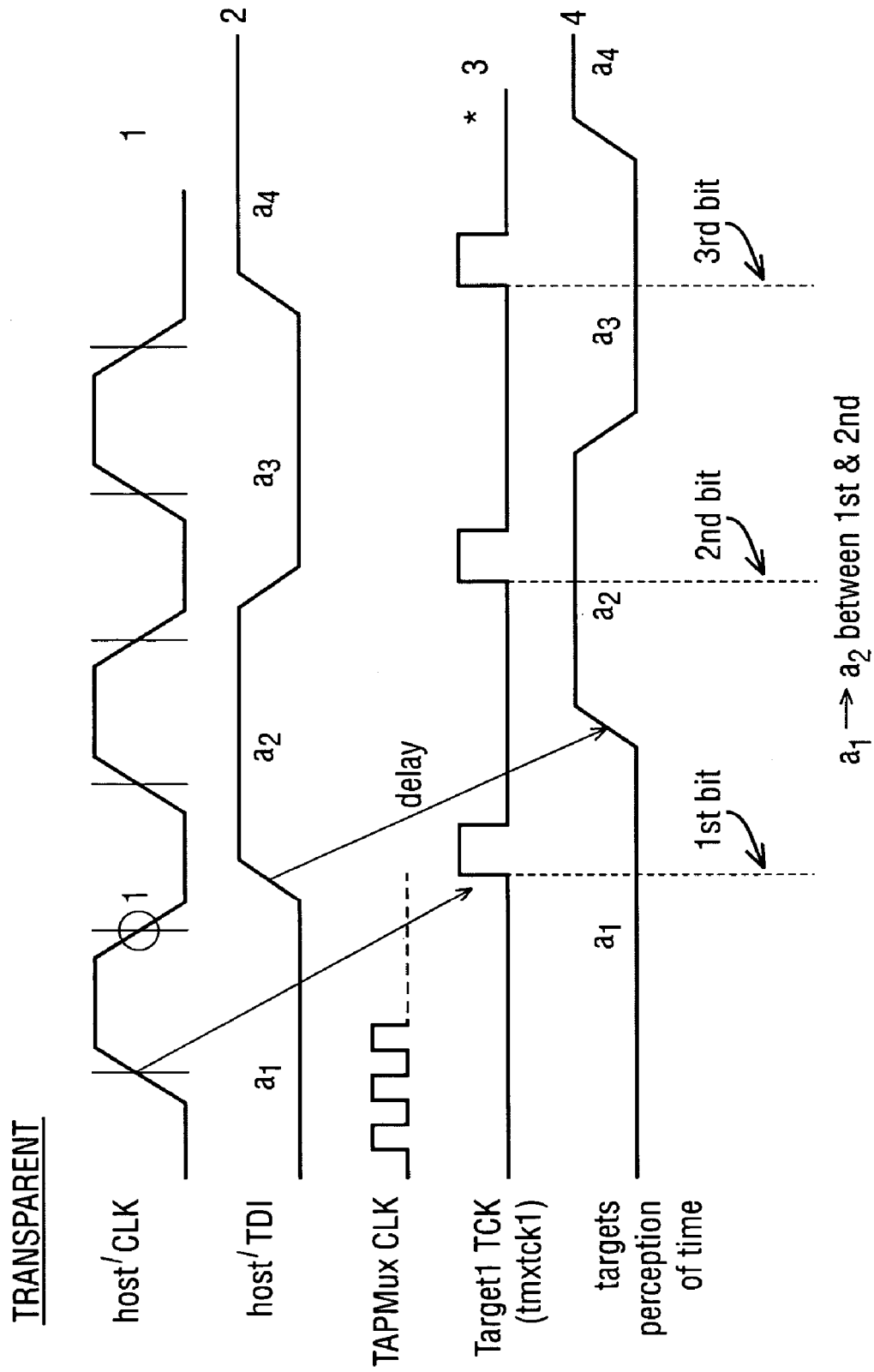
FIG. 17a illustrates transparent testing.

Firstly, the transparent data transfer will be described with reference to FIG. 17a. The external TAP multiplexer driver captures the positive edge of the host test clock signal (see signal marked 1 in FIG. 17a) and corresponding TMS and TDI data (see signal marked 2 in FIG. 17a) for each slot allocated to a particular channel and this is passed to the TAP multiplexer. The TAP multiplexer returns the test data (see signal marked 4 in FIG. 17a) in the corresponding slots. There is, therefore, a variable amount of time (counted in the TAP multiplexer clock periods shown by the signal marked 3 in FIG. 17a) to the start of the next allocated slot and a further fixed amount of time or delay (counted in the TAP multiplexer clock periods) before the corresponding test data is returned. There is no pipelining of data so the clock frequency for such a channel is significantly lower than the TAP multiplexer clock frequency. There is no additional clock latency (counted in clock periods for that channel) added to the path delay through the TAP multiplexer. This connection appears to be a direct or transparent connection and is suitable for connection with lower speed test devices which are not tolerant to pipeline or TAP controller daisy chain delays in the return path. In other words the integrated circuit receives test data from the external test circuitry and provides the associated test data out to the external test circuitry within one clock cycle of one of the host computers. The delay is not visible in terms of host clock cycle boundaries.

Thus, for the transparent mode, the delay is significantly less than the host clock period. Delay in this context is time taken for a signal from host to reach target (test equipment to TAP multiplexer 11), for signal interaction with the target and for returning a signal to the test equipment. In this embodiment, the clock period on the integrated circuit is much greater than the host clock period.

Figure 17B:
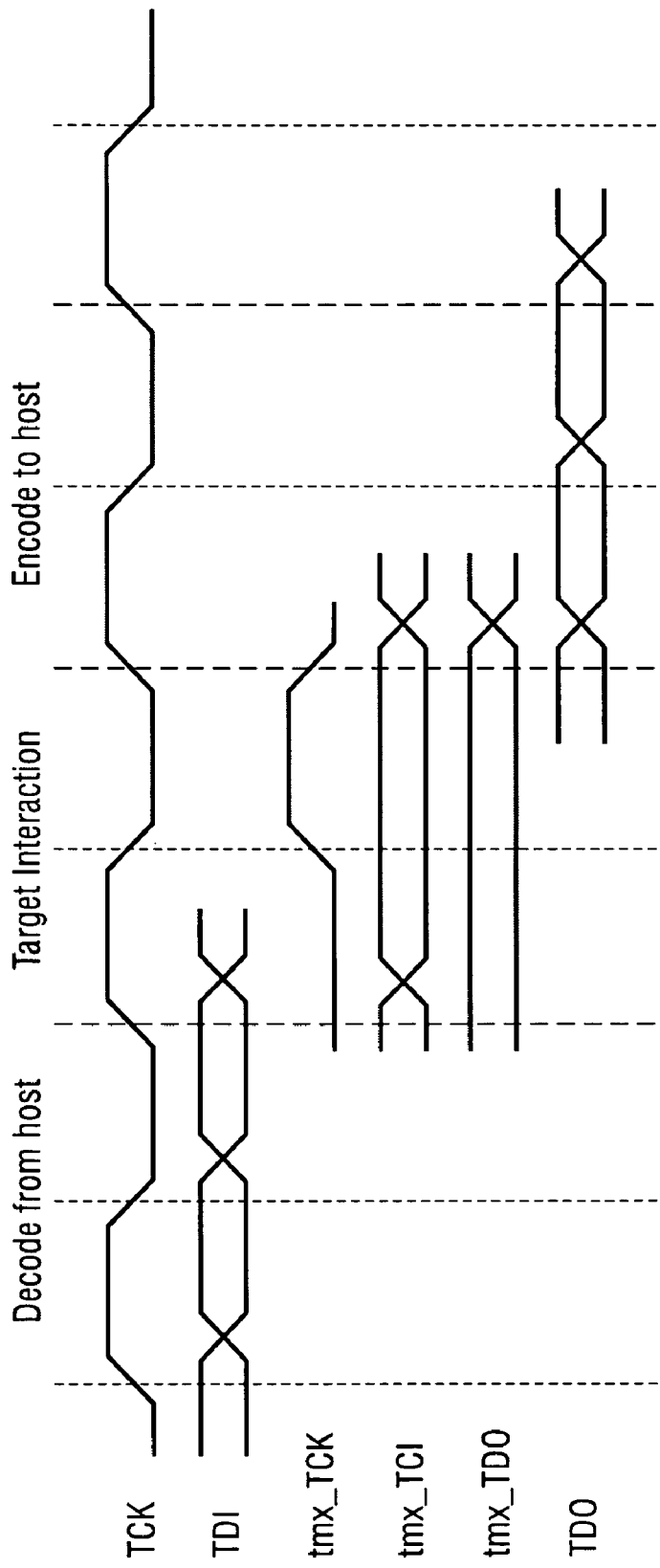
FIG. 17b shows pipeline testing.

In the pipelined data transfer mode, the external TAP multiplexer driver captures the positive edge of the host test clock and corresponding TMS and TDI data as it arrives for each channel. This is buffered in a FIFO and passed to the tap multiplexer using the slots allocated to that channel. The TAP multiplexer returns test data in the corresponding slots. There is a fixed clock latency added to the path delay through the TAP multiplexer. This connection adheres like a TAP controller daisy chain with a fixed pipeline delay. This is illustrated in FIG. 17b which shows three pipelining stages for the TAP multiplexer, that is the decoding occurs in the first clock cycle, interaction with the target occurs in the next clock cycle and returning the test data occurs in a third clock cycle.

In the pipeline mode, the delay is greater than the host clock period. As mentioned, delay is the time taken for a signal from the host to reach a target (test equipment to TAP multiplexer 11), for interaction with the target and for returning a signal (TDO) to the test equipment.

It should be understood that the relationship between input test data (TDI) and output test data (TDO) is a function of the test operation being performed and this relationship is known to the external test equipment. In pipeline mode, this relationship is shifted or delayed by a whole number of TCK clock cycles, and the external test equipment must therefore be cognizant or tolerant of this shift.

In this embodiment, the clock period TCK on the integrated circuit is the same or faster than the host clock period (but not as fast as in the transparent mode, relative to the host clock period).

The capture of data, processing, encoding, and transferring from target can measured as a finite number (substantially whole number) of clock periods in the pipeline mode.

Test equipment for the transparent mode is such that the FIFO of FIG. 9 can be omitted or at least the first location only thereof is used. The FIFO is required for the pipeline mode. Thus the FIFO may comprise buffer locations. The delay, that is time take to pass through the FIFO stage is thus greater than in the transparent mode.

Third party equipment may not be able to operate in pipeline mode. The pipeline mode may be quicker.

For a low clock frequency with a FIFO, the data will come out, for example three cycles of the host clock later which is undesirable. To improve the transparent performance, it is desirable to bypass as many FIFOs as possible. For higher speed clocks, FIFOS are required.

Embodiments of the invention do not require control information from the on-chip block in order to distinguish between the transparent mode and pipelined mode. The behaviour is the same for both modes for the on chip logic. The off chip logic may include additional complexity such that the combination of the off chip logic and the on chip logic give the correct behaviour in both modes of operation.

In embodiments of the invention there is consistent TCK three cycle operation in both modes of operation, that is decode from host, interaction with target and encode to host, on the integrated circuit.

The FIFOs 61, 62, 63, 64 shown in FIG. 9 are used differently in the two modes of operation. In the transparent mode of operation, only the first location is used whilst in the pipelined mode of operation the full depth of the FIFOs are used.

In one modification to the embodiments described above, the TAP controllers 13 and 14 and may be omitted. This is because these TAP controllers may not be used for structural test. The TAP controller functionality in block 15 may or may not be present. The master TAP controller may then be arranged so that it is only visible in the bypass mode and in the multiplex mode all the channels appear as having no TAP controller. The master TAP controller is used in structural test.

The above described embodiments have been described in the context of single bit serial data on TDI and TDO. It should be appreciated that additional signals may be provided to carry additional test data. In other words TDI and TDO may be provided by a plurality of inputs and outputs respectively. In preferred embodiments of the invention, the encoding scheme may only use the first TDI pin for control information.

In embodiments of the invention, TDI and corresponding internal derivatives of TDI may be extended by a plurality of connections for carrying additional information from the external equipment to the appropriate internal CPU. Likewise, TDO and corresponding internal derivatives of TDO may be extended by a plurality of connections for carrying additional information from the appropriate internal CPU to the external equipment. It is intended that the present invention encompass such changes and modifications as fall within the scope of the appended claims.

What is claimed is:

1. An integrated circuit comprising:
a plurality of portions, each portion including test control circuitry; and
at least one test input arranged to receive test signals,
one or more of said test control circuitry having a plurality of test modes comprising a structural test mode and a debug mode, wherein at least one of said test modes one or more of said plurality of portions are testable, and wherein said test control circuitry has a reset mode which has priority over said test modes and said structural test mode has priority over said debug mode wherein said debug mode comprises a multiplexer mode.

2. The circuit of claim 1, wherein said reset mode comprises a bypass mode.

3. The circuit of claim 1, wherein said reset mode has the highest priority of any modes of said integrated circuit.

4. The circuit of claim 1, wherein said test modes comprise a scan test mode.

5. The circuit of claim 1, wherein one of said test control circuitry comprises master test circuitry.

6. The circuit of claim 5, wherein said master test circuitry is arranged to test at least one other of the other portions of circuit.

7. The circuit of claim 5, wherein said master test circuitry is arranged to test all of the other portions of said circuit.

8. The circuit of claim 1, wherein said master test circuitry comprises a TAP controller.

9. The circuit of claim 1, wherein said test control circuitry comprises a TAP multiplexer for multiplexing input and/or output test data to/from a plurality of test circuitry.

10. The circuit of claim 9, wherein said TAP multiplexer comprises bypass combinatorial logic and sequential logic.

11. The circuit of claim 10, wherein said sequential logic is bypassed in said bypass mode.

12. The circuit of claim 10, wherein the sequential logic is tested via said master test circuitry.

13. The circuit of claim 1, wherein said structural test mode takes priority over a multiplexer mode in which said one of said test circuitry provides a multiplexer function.

14. The circuit of claim 1, wherein the integrated circuit comprises a selection by sequence mode.

15. An integrated circuit comprising:
a plurality of portions, each portion including test control circuitry; and
at least one test input arranged to receive test signals, one or more of said test control circuitry having a plurality of test modes comprising a structural test mode and a debug mode, wherein said structural test mode has priority over said debug mode and said debug mode comprises a multiplexer mode, wherein in at least one of said test modes on or more of said plurality of portions are testable, wherein said test control circuitry has a reset mode which has priority over said test modes so that if the chip powers up in a test mode a reset will cause the test mode to be exited and wherein said test mode comprises a multiplexer mode.

16. The circuit of claim 15, wherein said reset mode comprises a bypass mode.

17. The circuit of claim 15, wherein said reset mode has the highest priority of any modes of said integrated circuit.

18. The circuit of claim 15, wherein said test modes comprise a scan test mode.

19. The circuit of claim 15, wherein one of said test control circuitry comprises master test circuitry.

20. The circuit of claim 19, wherein said master test circuitry comprises a TAP controller.

* * * * *

UNITED STATES PATENT AND TRADEMARK OFFICE
CERTIFICATE OF CORRECTION

| | | |
|---|---|---|
| PATENT NO. | : 7,702,974 B2 | Page 1 of 1 |
| APPLICATION NO. | : 11/015772 | |
| DATED | : April 20, 2010 | |
| INVENTOR(S) | : Robert Warren | |

It is certified that error appears in the above-identified patent and that said Letters Patent is hereby corrected as shown below:

Column 26, claim 15, line 21, delete "on" and replace with --one--.

Signed and Sealed this
Fifth Day of April, 2011

David J. Kappos
*Director of the United States Patent and Trademark Office*